(12) United States Patent
Then et al.

(10) Patent No.: US 11,355,652 B2
(45) Date of Patent: Jun. 7, 2022

(54) GROUP III-NITRIDE POLARIZATION JUNCTION DIODES

(71) Applicant: Intel Corporation, Santa Clara, CA (US)

(72) Inventors: Han Wui Then, Portland, OR (US); Marko Radosavljevic, Portland, OR (US); Sansaptak Dasgupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/644,130

(22) PCT Filed: Sep. 29, 2017

(86) PCT No.: PCT/US2017/054358
§ 371 (c)(1),
(2) Date: Mar. 3, 2020

(87) PCT Pub. No.: WO2019/066908
PCT Pub. Date: Apr. 4, 2019

(65) Prior Publication Data
US 2021/0005759 A1    Jan. 7, 2021

(51) Int. Cl.
*H01L 29/88* (2006.01)
*H01L 27/02* (2006.01)
(Continued)

(52) U.S. Cl.
CPC .......... *H01L 29/88* (2013.01); *H01L 27/0255* (2013.01); *H01L 29/0649* (2013.01);
(Continued)

(58) Field of Classification Search
CPC . H01L 29/88; H01L 27/0255; H01L 29/0649; H01L 29/2003; H01L 29/205;
(Continued)

(56) References Cited

U.S. PATENT DOCUMENTS

| 4,216,036 A | 8/1980 | Tsang |
| 6,630,695 B2 | 10/2003 | Chen et al. |

(Continued)

FOREIGN PATENT DOCUMENTS

| JP | 2011049488 | 3/2011 |
| KR | 20140026486 | 3/2014 |

(Continued)

OTHER PUBLICATIONS

International Search Report and Written Opinion for PCT Patent Application No. PCT/US17/54358, dated Jun. 28, 2018.
(Continued)

*Primary Examiner* — Didarul A Mazumder
*Assistant Examiner* — Wasiul Haider
(74) *Attorney, Agent, or Firm* — Essential Patents Group, LLP

(57) ABSTRACT

Diodes employing one or more Group III-Nitride polarization junctions. A III-N polarization junction may include two III-N material layers having opposite crystal polarities. The opposing polarities may induce a two-dimensional charge sheet (e.g., 2D electron gas) within each of the two III-N material layers. Opposing crystal polarities may be induced through introduction of an intervening layer between two III-N material layers. The intervening layer may be of a material other than a Group III-Nitride. Where a P-i-N diode structure includes two Group III-Nitride polarization junctions, opposing crystal polarities at a first of such junctions may induce a 2D electron gas (2DEG), while opposing crystal polarities at a second of such junctions may induce a 2D hole gas (2DHG). Diode terminals may then couple to each of the 2DEG and 2DHG.

20 Claims, 14 Drawing Sheets

(51) Int. Cl.
*H01L 29/06* (2006.01)
*H01L 29/20* (2006.01)
*H01L 29/205* (2006.01)
*H01L 29/66* (2006.01)

(52) U.S. Cl.
CPC ........ *H01L 29/2003* (2013.01); *H01L 29/205* (2013.01); *H01L 29/66219* (2013.01)

(58) Field of Classification Search
CPC ......... H01L 29/66219; H01L 29/66204; H01L 27/0248; H01L 29/861
See application file for complete search history.

(56) References Cited

U.S. PATENT DOCUMENTS

| | | | |
|---|---|---|---|
| 8,021,904 | B2 | 9/2011 | Chitnis |
| 8,718,110 | B2 | 5/2014 | Kyono et al. |
| 2005/0098835 | A1 | 5/2005 | Ushiroda et al. |
| 2006/0124960 | A1 | 6/2006 | Hirose et al. |
| 2007/0194330 | A1 | 8/2007 | Ibbetson et al. |
| 2008/0185608 | A1* | 8/2008 | Chitnis ............... H01L 33/0093 257/99 |
| 2010/0059781 | A1 | 3/2010 | Yokobayashi et al. |
| 2010/0187550 | A1 | 7/2010 | Reed et al. |
| 2010/0327322 | A1 | 12/2010 | Kub et al. |
| 2011/0012109 | A1 | 1/2011 | Kryliouk et al. |
| 2011/0159669 | A1 | 6/2011 | Yang et al. |
| 2011/0233602 | A1 | 9/2011 | Hwang |
| 2012/0007097 | A1* | 1/2012 | Hebert ............... H01L 29/66143 257/76 |
| 2012/0012869 | A1 | 1/2012 | Song |
| 2012/0322189 | A1 | 12/2012 | Nakada et al. |
| 2013/0026489 | A1 | 1/2013 | Gambin et al. |
| 2013/0075824 | A1 | 3/2013 | Fukushima et al. |
| 2013/0221409 | A1 | 8/2013 | Nakajima et al. |
| 2014/0264380 | A1 | 9/2014 | Kub et al. |
| 2016/0300835 | A1 | 10/2016 | Xia et al. |
| 2016/0351564 | A1 | 12/2016 | Azize et al. |
| 2017/0018639 | A1 | 1/2017 | Teo et al. |
| 2017/0243866 | A1 | 8/2017 | Then et al. |
| 2018/0026156 | A1 | 1/2018 | Zhang et al. |
| 2018/0076291 | A1 | 3/2018 | Koyama et al. |
| 2018/0350944 | A1 | 12/2018 | Huang |
| 2020/0357742 | A1 | 11/2020 | Then et al. |
| 2021/0343703 | A1 | 11/2021 | Palacios et al. |
| 2022/0077349 | A1 | 3/2022 | Then et al. |

FOREIGN PATENT DOCUMENTS

| | | |
|---|---|---|
| WO | 2013101184 | 7/2013 |
| WO | 2016209263 | 12/2016 |
| WO | 2017153906 | 9/2017 |

OTHER PUBLICATIONS

International Preliminary Report on Patentability from PCT/US2017/054358 dated Apr. 9, 2020, 12 pgs.

Chu, Rongming, et al., "An Experimental Demonstration of GaN CMOS Technology", IEEE Electron Device Letters, vol. 37, No. 3, Mar. 2016, 3 pgs.

Hahn, B., et al., "First Monolithic Integration of GaN-Based Enhancement Mode n-Channel and p-Channel Heterostructure Field Effect Transistors", IRRRTED, vol. 60, No. 10. pp. 3005-3011, 2013.

Nakajima, Akira, et al., "GaN-based complementary metal-oxide-semiconductor inverter with normally off Pch and Nch MOSFETs fabricated using polarisation-induced holes and electron channels", IET Power Electron, 2018, vol. 11, Iss. 4, pp. 689-694.

* cited by examiner

GROUP III-NITRIDE POLARIZATION JUNCTION DIODES

CLAIM OF PRIORITY

This Application is a National Stage Entry of, and claims priority to, PCT Application No. PCT/US17/54358, filed on Sep. 29, 2017 and titled "GROUP III-NITRIDE POLARIZATION JUNCTION DIODES", which is incorporated by reference in its entirety for all purposes.

BACKGROUND

Diodes are a common circuit element employed within integrated circuits (ICs). Diodes are particularly useful for protecting circuitry from over-voltages, such as those associated with electrostatic discharge (ESD) events. Absent a protection circuit, discharge through a device such as a transistor, can cause catastrophic damage to an IC. Diodic protection circuits may therefore be configured as part of a functional IC to shunt surges in potential away from circuitry that could otherwise be damaged. Group III-Nitride ("III-N" or IUPAC "13-N") semiconductor materials offer the benefit of a relatively wide bandgap (~3.4 eV), enabling higher breakdown voltages than Si-based devices. III-N materials also offer advantageous attributable to high carrier mobility.

Within the Group III-nitride material system, diodes are often based on a structure where a 2 dimensional electron gas (2DEG) is contacted by a Schottky gate. Such Schottky diode designs are favorable over conventional p-n junction diodes because low hole density results in a poor p-n junction. The fabrication of a III-N Schottky diode typically involves etching of a polarization layer (often with dry plasma etch) from source, drain, and gate regions of a transistor. Dry plasma etches often damage the interface which can result in heightened electrical contact resistance between an N+ doped source or drain and the 2DEG. The same can occur between the Schottky gate and the 2DEG. Moreover, in such a lateral diode architecture, current injection and extraction from the 2DEG is confined to edges of the 2DEG, which may only be a few nanometers in thickness.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements. In the figures.

DETAILED DESCRIPTION

Figure 1:
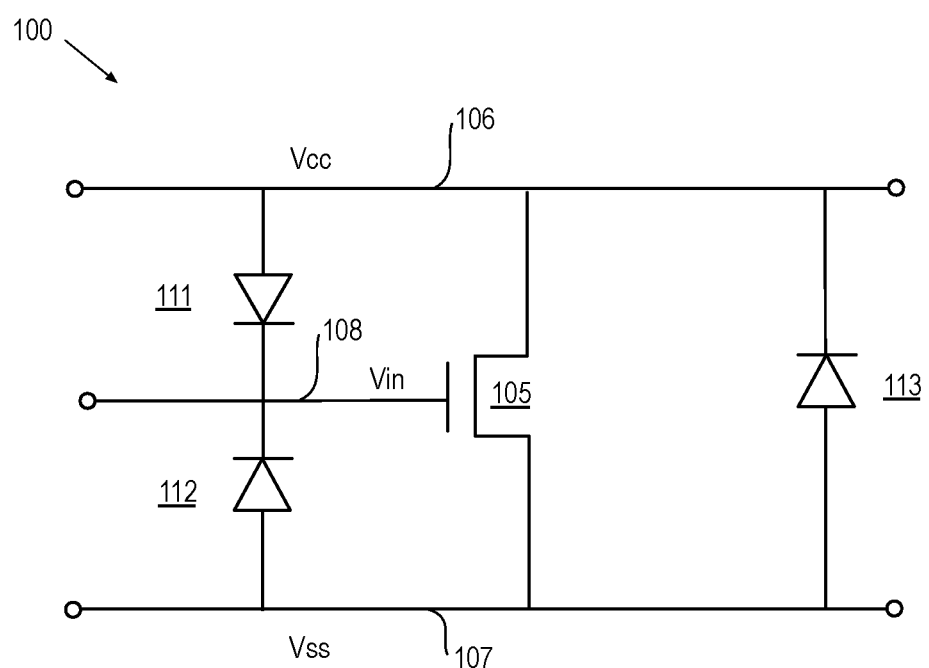
FIG. 1 is a schematic of an ESD protection circuit including at least one III-N polarization junction diode, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "above," "under," "below," "between," and "on" as used herein refer to a relative position of one component or material with respect to other components or materials where such physical relationships are noteworthy. For example in the context of materials, one material or material over/above or under/below another may be directly in contact or may have one or more intervening materials. Moreover, one material between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Diodes employing one or more III-N polarization junctions are described herein. As described further below, a III-N heterostructure that includes a plurality of III-N material layers or lamella may be employed within a diode. Diode structures in accordance with some embodiments include a first polarity inversion between a first layer of III-N material and a second layer of III-N material. The first and second III-N material layers may be separated by a first intervening layer that facilitates the first polarity inversion. The first polarity inversion may induce a first two-dimensional charge carrier sheet of a first type (e.g., a two dimensional electron gas or "2DEG") within each of the first and second layers of III-N material, for example near their interface with the first intervening layer. Diode structures in accordance with some embodiments further include a second polarity inversion between the second layer of III-N material and a third layer of III-N material. The second and third layers of III-N material may be separated by a second intervening layer that facilitates the second polarity inversion. The second polarity inversion may induce a second two-dimensional charge carrier sheet of a complementary type (e.g., a two dimensional hole gas or "2DHG") within each of the second and third III-N material layers, for example near their interface with the second intervening layer. The charge carrier sheets induced at each crystal inversion may be operable as terminals of a diode. The charge carrier sheets are dependent upon the spontaneous and piezoelectric polarization of the III-N material layers and are additive, resulting in very high carrier densities. Hence, with polarization junctions, P-i-N diode performance may exceed that of diode architectures that suffer from the low hole density typically achieved through impurity doping.

Diode architectures in accordance with one or more of the embodiments described herein may eliminate the need to form a rectifying metal-semiconductor (Schottky) interface, and may also enable vertical current conduction through the layers of III-N material instead of lateral current conduction through a single layer of III-N material that is contacted only at edges of a charge carrier sheet (e.g., 2DEG). Hence, with polarization junctions, P-i-N diode performance may also exceed that of Schottky diode architectures that often suffer from high contact resistance.

FIG. 1 is a schematic of an electrical circuit 100 including at least one III-N polarization diode, in accordance with some embodiments. Circuit 100 may, for example, be implemented by one or more IC chip, discrete components and combinations thereof. Circuit 100 may be implemented in any electronic device, such as, but not limited to, smartphones, ultrabook computers, embedded devices (e.g., internet of things, automotive applications, etc.), wearables, and the like. In circuit 100, one or more transistors 105 are to be protected from electrical surges by diodes 111, 112, and 113. Transistors 105 include a first terminal (e.g., source) coupled to a first supply rail 106 maintained at a nominal supply voltage (e.g., $V_{cc}$), and a second terminal (e.g., drain) coupled to second supply rail 107 maintained at a nominal reference voltage (e.g., $V_{ss}$). A third terminal (e.g., gate) of transistors 105 is coupled to a signal input 108, which conveys an input voltage yin. In circuit 100, transistors 105 are protected by diodes 111 and 112 connecting signal input 108 to the supply rails 106, 107 (e.g., $V_{cc}$ and $V_{ss}$, respectively), and by diode 113 connecting supply rail 106 to supply rail 107.

Under normal operating conditions, diodes 111, 112 and 113 are maintained in the off state (e.g., reverse biased) such that signal input 108 is effectively disconnected from supply rails 106, 107 while transistors 105 are driven by the supply voltage across rails 106, 107. However, upon experiencing a potential surge between signal input 108 and supply rails 106 and 107, the transient will forward bias one or more of diodes 111, 112 and 113, turning them on. Which of diodes 111, 112 and 113 become forward biased is dependent on the charge polarity of the surge relative to the supply rail potentials. Charge accumulated at voltage input 108 is thereby dissipated or shunted through the diode path around transistors 105. In accordance with some embodiments, one or more diodes of a protection circuit (e.g., diodes 111, 112 and 113) employ one or more III-N polarization junctions, each having one or more of the features described further below. The improved performance (e.g., lower on-resistance) of such diodes may advantageously reduce the footprint of circuit 100, and/or improve the robustness of circuit 100.

In some exemplary embodiments where transistors 105 are silicon-based, based on another group IV semiconductor, a III-V semiconductor, or a III-N compound, at least one of diodes 111, 112 and 113 that employ a III-N polarization junction P-i-N diode architecture in accordance with embodiments herein are implemented as discrete devices (i.e., not monolithic with transistors 105). In some other embodiments where transistors 105 are silicon-based, based on another group IV semiconductor, a III-V semiconductor, or a III-N compound, at least one of diodes 111, 112 and 113 that employ a III-N polarization junction P-i-N diode architecture in accordance with embodiments herein are implemented monolithically with transistor 105 as portions of an IC. In either case, any of the III-N polarization junction diodes described further herein may be employed in circuit 100. Any of the III-N polarization junction diodes described further herein may also be employed in any other suitable protection circuit designs. Any of the III-N polarization junction diodes described further herein may also be employed in circuits having functions other than ESD protection, such as, but not limited to, high voltage power management circuitry.

Figure 2:
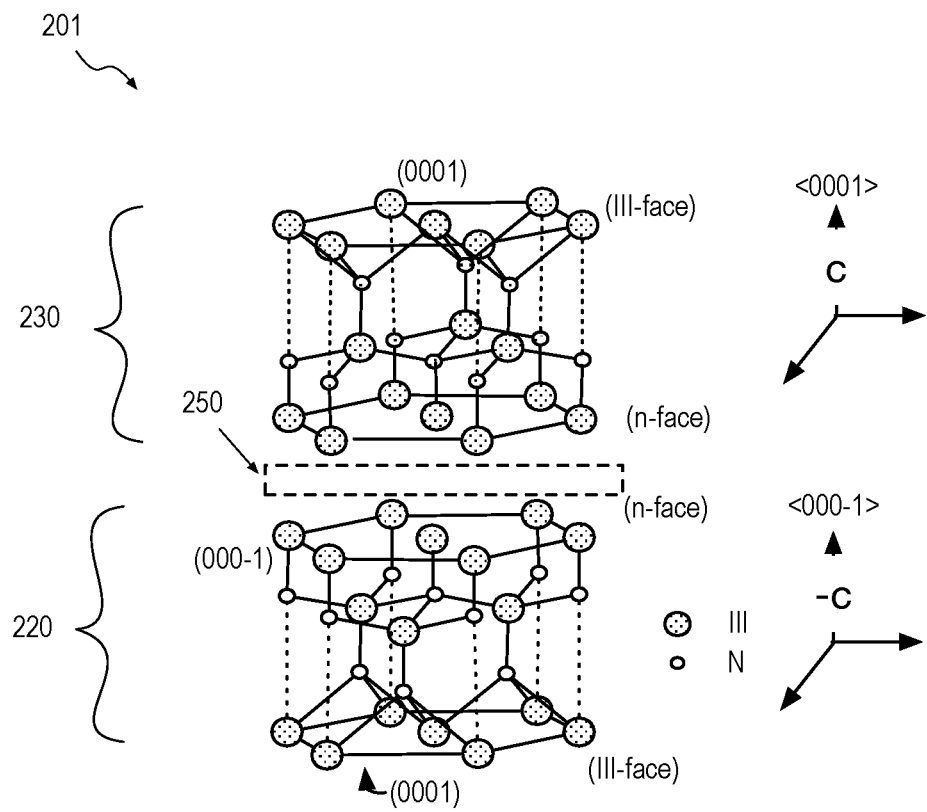
FIG. 2 is an isometric illustration showing crystal polarity inversion at a first III-N polarization junction, in accordance with some embodiments.
Figure 3:
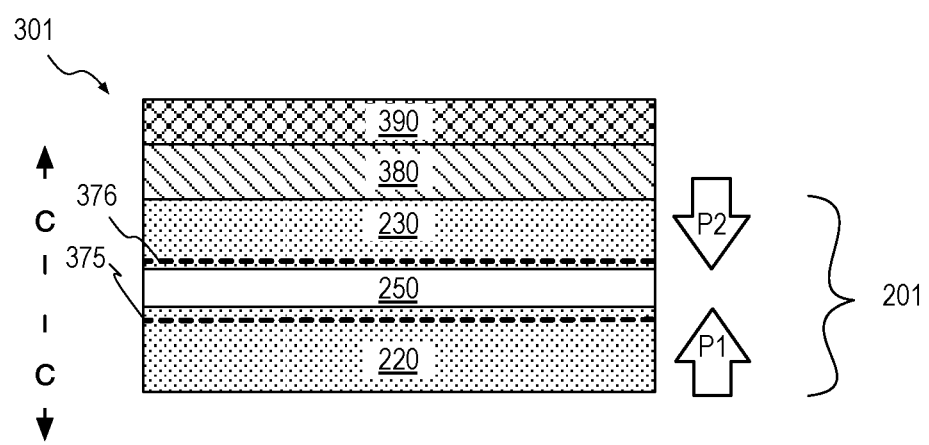
FIG. 3 is a cross-sectional view of material layers of the III-N polarization junction shown in FIG. 2, in accordance with some embodiments.

FIG. 2 is an isometric illustration showing crystal polarity inversion of a III-N polarization junction 201, in accordance with some embodiments. FIG. 3 is a cross-sectional view of a device terminal (e.g., cathode) 301 including the III-N polarization junction 201, in accordance with some embodiments. Any of diodes 111, 112, or 113 (FIG. 1) may have one or more of the features further described in the context of III-N polarization junction 201, or device terminal 301.

As shown in FIG. 2, polarization junction 201 includes a Group III-nitride (III-N) material layer 220, intervening layer 250, and a III-N material layer 230. Although illustrated as layers for the sake of simplification, it is noted that equivalent references may be made to laterally (horizontally) arranged III-N material regions. III-N material layer 220 may be any III-N material, such as a binary alloy (e.g., GaN, AlN, InN), a ternary alloy (e.g., $Al_xIn_{1-x}N$ or $Al_xGa_{1-x}N$), or quaternary alloy (e.g., $In_xGa_yAl_{1-x-y}N$). III-N material layer 230 may likewise be any III-N material. In some embodiments, III-N material layer 230 has the same composition as III-N material layer 220. In other embodiments, III-N material layer 230 has a composition distinct from III-N material layer 220. III-N material layer 230 may be, for example, a binary alloy (e.g., GaN, AlN, InN), a ternary alloy (e.g., $Al_xIn_{1-x}N$ or $Al_xGa_{1-x}N$), or quaternary alloy (e.g., $In_xGa_yAl_{1-x-y}N$). In some advantageous embodiments, III-N material layers, 220, 230 are intrinsic and not intentionally doped with impurities associated with a particular conductivity type. Intrinsic impurity (e.g., Si) levels in III-N material layers, 220 and 230 may be advantageously less than 1e17 atoms/cm$^3$, and in some exemplary embodiments is between 1e14 and 1e16 atoms/cm$^3$. In some such embodiments, III-N material layers, 220, 230 are both intrinsic binary GaN (i-GaN).

In some exemplary embodiments, III-N material layers 220 and 230 each have monocrystalline microstructure (e.g., hexagonal Wurtzite). Although monocrystalline, it is noted that crystal quality of the III-N crystal may vary dramatically, for example as a function of the techniques employed to form material layers 220 and 230. In some exemplary embodiments, dislocation density with III-N material layers 220 and 230 is in the range of $10^8$-$10^{11}$/cm$^2$. FIG. 2 illustrates crystal orientations of III-N material layers, 220 and 230, in accordance with some embodiments. The crystal structure of III-N material layer 220 lacks inversion symmetry, as does the crystal structure of III-N material layer 230. As shown, III-N material layer 220 has a polar group III (e.g., Ga)-face and a polar nitrogen (N)-face. Higher order planes may be semi-polar. The (0001) and (000-1) planes are not equivalent. Relative to a plane of intervening layer 250, III-N material layer 220 may be characterized as having −c polarity with the c-axis extending in the <000-1> direction that is out of the plane of intervening layer 250, and/or of an underlying substrate (not depicted). The orientation of III-N material layer 220 may therefore be referred as N-face, (e.g., N-face III-N), or as (000-1) III-N, or as having N-polarity (−c). The crystal orientation of III-N material layer 230 is inverted relative to that of III-N material layer 220, and may be characterized has having +c polarity with the c-axis extending in the <0001> direction out of the plane intervening layer 250, and/or of an underlying substrate. The orientation of III-N material layer 230 may therefore be referred as Group III-face, or III-face III-N, or (000-1) III-N, or as having Group III-polarity (+c).

As further illustrated in FIG. 3, with the crystal orientation, or crystal polarity, of III-N material layer 230 inverted with respect to that of III-N material layer 220, the c-axes of III-N material layers 220 and 230 are substantially aligned anti-parallel. Although illustrated as anti-parallel, it is noted that the crystal orientations material layers 220 and 230 may very by 5-10° from their target as a result of processing conditions, and such misalignment of the crystals is acceptable as the impact may merely be a slight reduction in polarization field strength. The junction between III-N material layers 220 and 230 is referred to herein as a "polarization junction" for at least the reason that crystals of different polarization or polarity meet (e.g., at their interface with intervening layer 250). III-N material layer 220 is associated with a polarization field strength $P_1$ that is a function of spontaneous and/or piezoelectric polarization field strength for the selected III-N alloy composition. III-N material layer 230 is likewise associated with a polarization field strength $P_2$ that is a function of spontaneous and/or piezoelectric polarization field strength for the selected III-N alloy composition. Because of the anti-parallel polarities of III-N material layer 220 and III-N material layer 230, two dimensional charge carrier (gas) sheets 375 and 376 are formed within at least a portion of III-N material layers 220, 230 proximal to their interface (e.g., proximal to intervening material layer 250). Notably, because of the anti-parallel crystal polarities, the two dimensional charge carrier sheets 375 and 376 are induced by a summation of the polarization field strengths P1 and P2. This is in contrast to a charge carrier gas that may be induced as a result of differences between the polarization field strengths of two different III-N compositions at a heterojunction having a single crystal polarity. Hence, in some exemplary embodiments where III-N material layers 220 and 230 have the same composition (e.g., both are i-GaN), polarization field strength P1 is equal to polarization field strength P2 (i.e., P1=P2). Following Maxwell's equations, the two dimensional charge carrier sheets 375 and 376 are then are result of a field equal to −P2−P2, or −2*P2. Thus, very high charge carrier densities may be present within a few nanometers on either side of polarization junction 201.

With the relative crystal orientations shown in FIGS. 2 and 3, two dimensional charge carrier sheets 375 and 376 are high-density electron gases (2DEG) proximal (e.g., with 2-4 nm) to the interface of intervening material layer 250. The 2DEGs are the result of III-N material layer 220 having the polar N-face adjacent to intervening layer 250 and the polar Group III-face (e.g., Ga-face) opposite, or distal to, intervening material layer 250. III-N material layer 230 also has the nitrogen (N)-face adjacent to intervening layer 250, and the Group III-face (e.g., a Ga-face) opposite, or distal to, intervening material layer 250. Polarization junction 201 (FIG. 2) may therefore be referred to as an N-type polarization junction.

Intervening material layer 250 may be any material or materials suitable for facilitating the formation of polarization junction 201. For example, in some embodiments intervening layer 250 includes a material that facilitates a crystal polarity inversion during an epitaxial growth of III-N material layer 230. For such embodiments, intervening layer 250 may be (mono)crystalline. As another example, in some embodiments intervening layer 250 includes a material that facilitates a bonding of III-N material layer 230 to III-N material layer 220. For such embodiments, intervening layer 250 may be (mono)crystalline, (poly)crystalline, or amorphous.

In some exemplary crystalline embodiments, intervening material layer 250 has other than hexagonal crystallinity (i.e., crystallinity other than that of III-N material layers 220, 230). In some examples, intervening material layer 250 may have trigonal crystallinity. In some other examples, intervening material layer 250 may have cubic crystallinity. Having crystallinity other than that of the III-N material system may advantageously facilitate polarity inversion while still providing a crystalline seeding surface that can maintain monocrystallinity of III-N material layer 230, for example. In some exemplary embodiments, intervening layer 250 is other than a III-N material. Intervening layer 250 may, for example, include one or more of oxygen, a metal, or a metalloid. The metal may more specifically be a rare earth, a lanthanide, a transition metal, or a post-transition (e.g., group III) metal. In some exemplary embodiments, intervening layer 250 is, or includes, aluminum oxide ($Al_xO_y$). In some such embodiments, intervening layer 250 is crystalline aluminum oxide (e.g., sapphire). In some other embodiments, intervening material layer 250 is, or includes, scandium oxide ($Sc_xO_y$). In some other embodiments, intervening material layer 250 is, or includes, scandium nitride ($Sc_xN_y$) material, aluminum oxy-nitride (AlNO), or scandium oxy-nitride (ScNO). In some such embodiments, intervening layer 250 is crystalline scandium oxide. In still other embodiments, intervening material layer 250 is, or includes, a mixed metal alloy, such as, but not limited to, aluminum scandium oxide.

Although in some embodiments, intervening material layer 250 is in direct contact with both III-N material layer 220 and III-N material layer 230, one or more material layers may also separate intervening material layer 250 from III-N material layer 220 and/or from intervening material layer 230. For example, intervening material layer 250 may be within a stack of material layers separating III-N material layer 220 from III-N material layer 230. In some embodiments, intervening material layer 250 is in contact with (e.g., on or under) a (mono)crystalline aluminum nitride (AlN) layer, or other crystalline III-N material suitable as an epitaxial nucleation layer. For example, intervening material layer 250 may be an oxide of an underlying AlN layer, or an oxide of an overlying AlN layer. In either case, intervening material layer 250 may be predominantly $Al_xO_y$. Intervening material layer 250 may also be between two (mono)crystalline aluminum nitride layers. For example, intervening material layer 250 may be a layer of aluminum oxide located between a first and a second (mono)crystalline aluminum nitride layer.

In some amorphous or polycrystalline embodiments, intervening material layer 250 is, or includes, one or more of, aluminum oxide, silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, tantalum oxide, tantalum silicon oxide, lead scandium tantalum oxide, and lead zinc niobate.

Intervening material layer 250 may have any suitable thickness (e.g., along the c-axis). In some embodiments, intervening material layer 250 has a thickness not more than 5 nm, and advantageously not more than 3 nm. In an embodiment, intervening material layer 250 is a crystalline material including less than 10, advantageously less than 7, and potentially even less than 5 monolayers.

As further illustrated in FIG. 3, device terminal (e.g., diode cathode) 301 further includes a terminal material 380 that is electrically coupled to a first side of polarization junction 201. Terminal material 380 is operable as a low resistance contact to polarization junction 201. Device terminal 301 may be further coupled to one or more other device terminal (not depicted in FIG. 3) in any suitable manner. For example, terminal material 380 may be electrically coupled through, or across, one or more of charge carrier sheets 375, 376 to another device terminal (e.g., a diode anode) that is laterally or vertically spaced apart from terminal 301. An additional device terminal may be coupled to charge carrier sheet 375 and/or 376 in any manner, such as, but not limited to, a rectifying contact (e.g., a Schottky metal-semiconductor junction), or an ohmic contact (e.g., another impurity-doped terminal material layer) that is on a same side of intervening material layer 250 as terminal material 380. Alternatively, an additional device terminal may be coupled to charge carrier sheet 375 and/or 376 through intervening material layer 250. For such embodiments, charge carriers may tunnel through intervening material layer 250 to a rectifying contact or an ohmic contact that is on a side of intervening material layer 250 opposite terminal material 380, for example as further described below.

In the illustrative embodiment, terminal material 380 is a III-N material having the same crystal orientation (e.g., +c polarity) as III-N material layer 230, and may advantageously include one or more impurity dopants imparting a desired conductivity type (e.g., N-type). In some exemplary embodiments, terminal material 380 includes a donor impurity dopant such as Si or Ge. In some such embodiments, the donor impurity density is at least $1e18/cm^3$ within terminal material 380, and advantageously $1e19/cm3$, or more. Terminal material 380 may form a homojunction with III-N material layer 230, or terminal material 380 may form a heterojunction with III-N material layer 230. Hence terminal material 380 may have the same majority lattice constituents as III-N material layer 230 or include other majority lattice constituents. In some advantageous embodiments, lower contact resistance to polarization junction 201 may be achieved where terminal material 380 forms a heterojunction (e.g., abrupt or graded) with III-N material layer 230. In some exemplary embodiments, terminal material 380 has a narrower band gap than that of III-N material layer 230. For example, terminal material 380 may be a III-N alloy that includes more Indium (In) than III-N material layer 230. In some embodiments, for example, terminal material layer 380 is donor-doped $In_xGa_{1-x}N$, where x is between 0.05 and 0.2.

Device terminal 301 may further includes a contact metal 390. Contact metal 390 may include any metallization known to be suitable for providing a non-rectifying contact (e.g., ohmic or tunneling metal-semiconductor junction) to terminal material 380. In some exemplary embodiments, contact metal 390 includes at least one metal, such as Ti, Al, or W. Notably, device terminal 301 comprises an electrical coupling to polarization junction 201 that scales with the footprint (lateral area) of polarization junction 201 in a plane of III-N material layers 220, 230 and 380. Current between contact metal 390 and polarization junction 201 is therefore substantially vertical, or out of the plane of III-N material layer 230. Thicknesses of III-N material layer 230 and terminal material layer 380 may therefore be constrained to achieve a desired device terminal resistance. In some exemplary embodiments, III-N material layer 230 has a thickness less than 10 nm. In some further embodiments, III-N material layer 230 has a thickness of at least 3 nm. Terminal material layer 380 may have any thickness permissible as a function of its conductivity.

Figure 4:
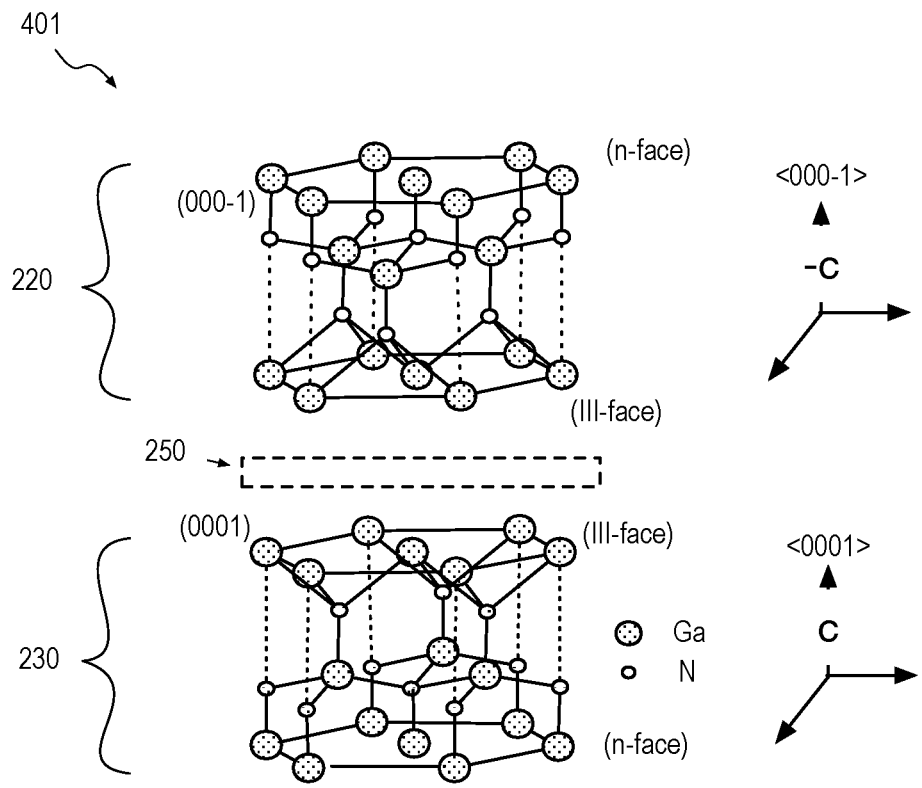
FIG. 4 is an isometric illustration showing crystal polarity inversion at a second III-N polarization junction, in accordance with some embodiments.
Figure 5:
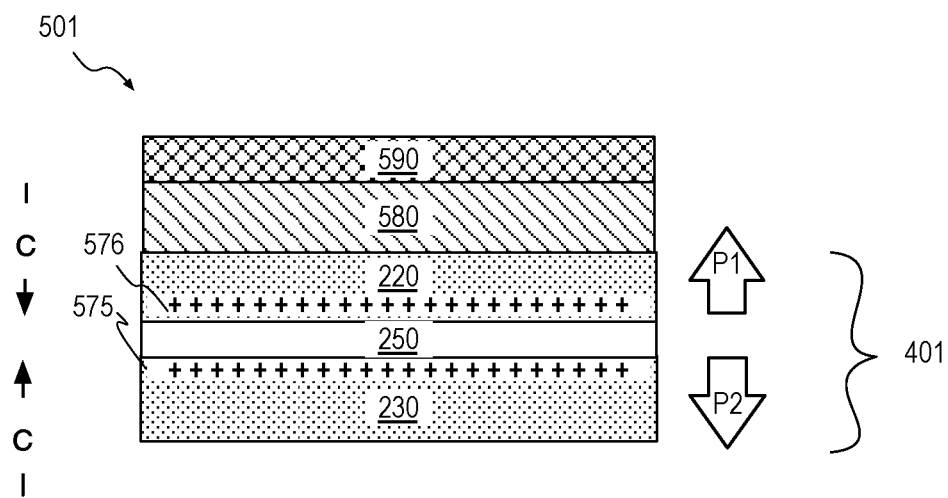
FIG. 5 is a cross-sectional view of material layers of the III-N polarization junction shown in FIG. 4, in accordance with some embodiments.

FIG. 4 is an isometric illustration showing crystal polarity inversion at a III-N polarization junction 401, in accordance with some embodiments. FIG. 5 is a cross-sectional view of a device terminal 501 that includes III-N polarization junction 401, in accordance with some embodiments. Any of diodes 111, 112, or 113 (FIG. 1) may have one or more of the features further described in the context of III-N polarization junction 401, or device terminal 501.

As shown in FIG. 5, polarization junction 401 again includes III-N material layer 220, intervening layer 250, and III-N material layer 230. The reference numbers introduced in the context of FIG. 2 and FIG. 3 are retained in FIG. 4 and FIG. 5 for material layers that have the same properties described above in the context of polarization junction 201 and terminal 301. Polarization junction 401 is however a P-type polarization junction with two dimensional (2D) charge carrier sheets 575 and 576 being high-density two-dimensional hole gases (2DHG) proximal (e.g., with 2-4 nm) of the interface of intervening material layer 250. The 2DHGs are the result of III-N material layer 220 having the Group III-face (e.g., Ga-face) adjacent to intervening layer 250 and the N-face opposite, or distal to, intervening material layer 250, while III-N material layer 230 also has the Group III-face (e.g., a Ga-face) adjacent to intervening layer 250, and the N-face opposite, or distal to, intervening material layer 103. III-N material layer 220 is again associated with polarization field strength $P_1$ that is a function of spontaneous and/or piezoelectric polarization field strength for the selected III-N alloy composition. III-N material layer 230 is likewise associated with polarization filed strength $P_2$. Because of the substantially anti-parallel polarities of III-N material layer 220 and III-N material layer 230, two dimensional charge carrier (gas) sheets 575 and 576 are formed within at least a portion of III-N material layers 220, 230 proximal to their interface (e.g., proximal to intervening material layer 250). Notably, the two dimensional charge carrier sheets 575 and 576 are induced by a summation of the polarization field strengths P1 and P2. In some exemplary embodiments where III-N material layers 220 and 230 have the same composition (e.g., both are i-GaN), polarization field strength P1 is equal to polarization field strength P2 (i.e., P1=P2). Following Maxwell's equations, the two dimensional charge carrier sheets 575 and 576 are then are result of a field equal to +P2+P2, or 2*P2. Thus, for polarization junction 401, the anti-parallel polarities of III-N material layers 220, 230 point away from polarization junction 401. The resultant polarization doping is complementary to that associated with polarization junction 201 (FIG. 2).

Intervening material layer 250 may be any of the materials described above. Device terminal (e.g., anode) 501 further includes a terminal material layer 580 that is electrically coupled to a first side of polarization junction 401. Terminal material layer 580 is operable as a low resistance contact to polarization junction 401. Device terminal 501 may be further coupled to one or more other device terminal (not depicted in FIG. 5) in any suitable manner. For example, terminal material 580 may be electrically coupled through, or across, one or more of charge carrier sheets 575, 576 to another device terminal (e.g., a diode cathode) that is laterally or vertically spaced apart from terminal 501. An additional device terminal may be coupled to charge carrier sheet 575 and/or 576 in any manner, such as, but not limited to, a rectifying contact or an ohmic contact that is on a same side of intervening material layer 250 as terminal material 580. Alternatively, an additional device terminal may be coupled to charge carrier sheet 575 and/or 576 through intervening material layer 250. For such embodiments, charge carriers may tunnel through intervening material layer 250 to a rectifying contact or an ohmic contact that is on a side of intervening material layer 250 opposite terminal material 580, for example as further described below.

In some embodiments, terminal material layer 580 is a III-N material having the same crystal orientation (e.g., −c polarity) as terminal material layer 220 and may advantageously include one or more impurity dopants imparting a desired conductivity type (e.g., P-type). In some exemplary embodiments, terminal material layer 580 includes acceptor impurity dopants, such as, but not limited to, Mg. While III-N materials can be challenging to dope p-type, dopant levels of 1e17 atoms/cm³ to 1e18 atoms/cm³ are achievable with Mg doping of binary GaN, for example. Terminal material layer 580 may form a homojunction with III-N material layer 220, or terminal material layer 580 may form a heterojunction with III-N material layer 220. Hence terminal material layer 580 may have the same, or different, majority lattice constituents as III-N material layer 220. In some advantageous embodiments, lower contact resistance to polarization junction 401 may be achieved where terminal material layer 580 forms a heterojunction (e.g., abrupt or graded) with III-N material layer 220. In some exemplary embodiments, terminal material layer 580 has a narrower band gap than that of III-N material layer 220. For example, terminal material layer 580 may be a III-N alloy that includes more Indium (In) than III-N material layer 220. In some embodiments, for example, terminal material layer 580 is acceptor-doped $In_xGa_{1-x}N$, where x is between 0.05 and 0.2.

Device terminal 501 further includes a contact metal 590. Contact metal 590 may include any metal known to be suitable for providing a non-rectifying contact (e.g., ohmic or tunneling metal-semiconductor junction) to terminal material 580. In some exemplary embodiments, contact metal 590 includes at least one metal, such as Ni, Pt, Pd, or W. Notably, device terminal 501 comprises an electrical coupling to polarization junction 401 that scales with the footprint (lateral area) of polarization junction 401 in a plane of material layers 220, 230 and 580. Current between contact metal 590 and polarization junction 401 is therefore substantially vertical, or out of the plane of terminal material layer 580 and III-N material layer 220. Thicknesses of III-N material layers 220 and 580 may therefore be constrained to achieve a desired device terminal resistance. In some exemplary embodiments, III-N material layer 220 has a thickness less than 10 nm. In some further embodiments, III-N material layer 220 has a thickness of at least 3 nm. Terminal material layer 580 may have any thickness permissible as a function of its conductivity.

Figure 6A:
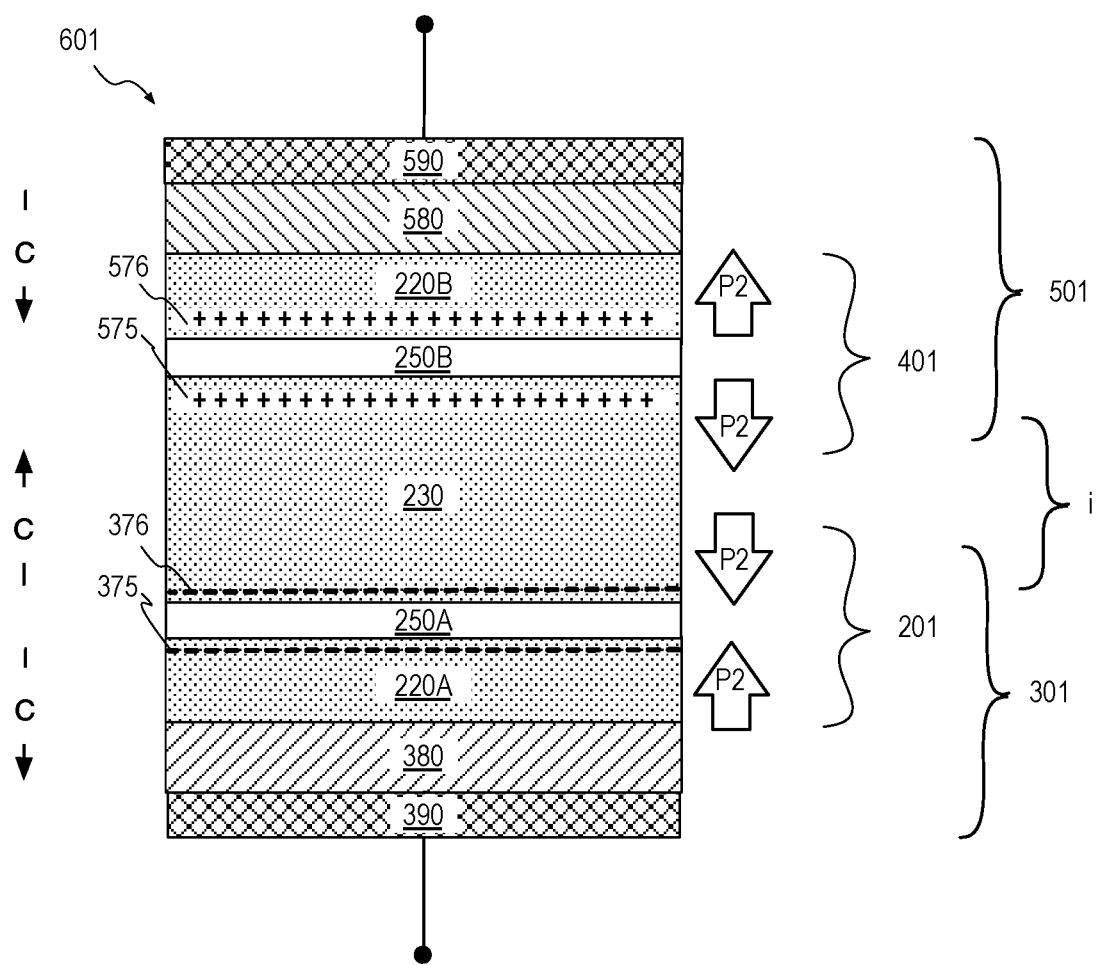
FIG. 6A is a cross-sectional view of a P-i-N diode employing two polarization junctions, in accordance with some embodiments.

FIG. 6A is a cross-sectional view a P-i-N diode 601 that includes two polarization junctions, in accordance with some embodiments. Diode 601 includes terminal 501 stacked upon terminal 301 such that the c-axes are substantially aligned parallel and anti-parallel. As shown, diode 601 includes polarization junction 201, which is n-type and has 2DEG 375 and 2DEG 376 on either side of a first intervening layer 250A. Diode 601 further includes polarization junction 401, which is p-type and has 2DHG 575 and 2DHG 576 on either side of a second intervening layer 250B. As such, terminal 301 is operative as a cathode while terminal 501 is operative as an anode. Current conduction between contact metals 390 and 590 is predominantly along the c-axis of III-N material layers 220 and 230.

Diode 601 includes the two contact metals 390 and 590 separated by a first (bottom) III-N material layer 220A that is over a terminal material 380, a first (bottom) intervening layer 250A that is over the first III-N material layer 220A, III-N material layer 230 that is over intervening layer 250A, a second intervening layer 250B that is over III-N material layer 230, another (top) III-N material layer 220B that is over intervening layer 250B, and terminal material 580 that is over III-N material layer 220. In the illustrated embodiment, each of the depicted layers are in direct contact with the material layer above and below. However, one or more other material layers (not depicted) may be inserted between various ones of the illustrated layers. Furthermore, a diode architecture functionally similar to diode 601 may be implemented by laterally arranging these same materials into a horizontal layout rather than the vertical layout shown.

The reference numbers introduced in the context of FIG. 2-FIG. 5 are retained in diode 601 for material layers that may have any of the properties as described above. The suffixes "A" and "B" are added to emphasize how terminals 301 and 501 are incorporated into diode 601. Material layers with reference numbers ending with "A" and "B" may have any of the properties described for material layers of the same root reference number. Hence, for diode 601 intervening material layers 250A and 250B may both have any of the properties described above for intervening material layer 250. Likewise III-N material layers 220A and 220B may both have any of the properties described above for III-N material layer 220. Although each the material layers in diode 601 may all be different composition and be any of those compositions described above in the context of terminals 301 and 501, in the illustrated embodiment III-N material layer 230 has the same composition as III-N material layers 220A and 220B located on opposite faces of III-N material layer 230. In some embodiments, III-N material layer 230 and III-N material layers 220A and 220B are all binary GaN. III-N material layer 230 and III-N material layers 220A and 220B may also all be undoped (i.e., not intentionally doped with donor or acceptor impurities). As described above, terminal layer 380 may be doped with donor impurities (e.g., Si) while terminal layer 580 may be doped with acceptor impurities (e.g., Mg). The polarization fields are all P2 when III-N material layers 220A, 220B and 230 are all of the same material composition. Diode 601 has the advantage of high charge densities achieved through the polarization properties of the III-N material system. These high charge densities are concentrated in only a few nanometers at the opposite faces of III-N material layer 230. Charge induction for diode 601 is therefore not dependent on impurity dopant concentration. The functional role of any doped material layers (e.g., terminal layers 380 and 580) within diode 601 is limited to providing a terminal contact. As shown, the N-face of III-N material layer 230 forms polarization junction 201 while the Group III-face of III-N material layer 230 forms polarization junction 401. Within diode 601, III-N material layer 230 is operative as an intrinsic (i) layer of the diode with p-type and n-type junctions at opposite faces of III-N material layer 230. III-N material layer 230 should be of sufficient thickness to avoid merging or band-to-band tunneling between 2DEG 376 and 2DHG 575. In some embodiments, III-N material layer 230 has a thickness greater than that of at least one of III-N material layers 220A and 220B. In some embodiments, III-N material layer 230 has a thickness greater than that of each of III-N material layers 220A and 220B. In some exemplary embodiments, III-N material layer 230 is no more than 10 nm in thickness (e.g., along c-axis), while the thicknesses of III-N material layers 220A and 220B may each vary as described above for III-N material layer 220.

Electrical current across III-N material layers 220A and 220B and III-N material layer 230 also transits intervening layers 250A, 250B. In some advantageous embodiments where each of the intervening layers 250A and 250B have sufficiently small thickness (e.g., a few nanometers), charge carriers may tunnel through barriers in the conduction and/or valence band associated with intervening layers 250A and 250B. Such tunneling may occur over the entire footprint of diode 601. Barriers in the conduction and or valence band are dependent on the band gap and/or band gap offsets between III-N material layers 220A, 220B, and III-N material layer 230. For embodiments where III-N material layers 220A and 22B, and III-N material layer 230 all have the same composition (e.g., GaN), intervening material layers 250A, 250B introduce the only variation in the energy bands within diode 601. Each of intervening layers 250 may have any of the compositions described above. In some embodiments, both intervening material layers 250A, 250B have the same composition(s) (e.g., $Al_xO_y$, AlON, etc.).

Notably, the illustrated diode architecture lacks any Schottky rectification, and diode 601 may avoid limitations associated with Schottky diode architectures, such as high on-state resistance. Charge induction for diode 601 is also scalable with a footprint (area) of diode 601 as terminal contact area is substantially equal to the area of 2DEGs 375, 376, and 2DHG 575, 576. Accordingly, diode 601 may display a figure of merit (e.g., resistance*capacitance*area) superior to that of other diodes, including those with other architectures employing the III-N material system.

Figure 6B:
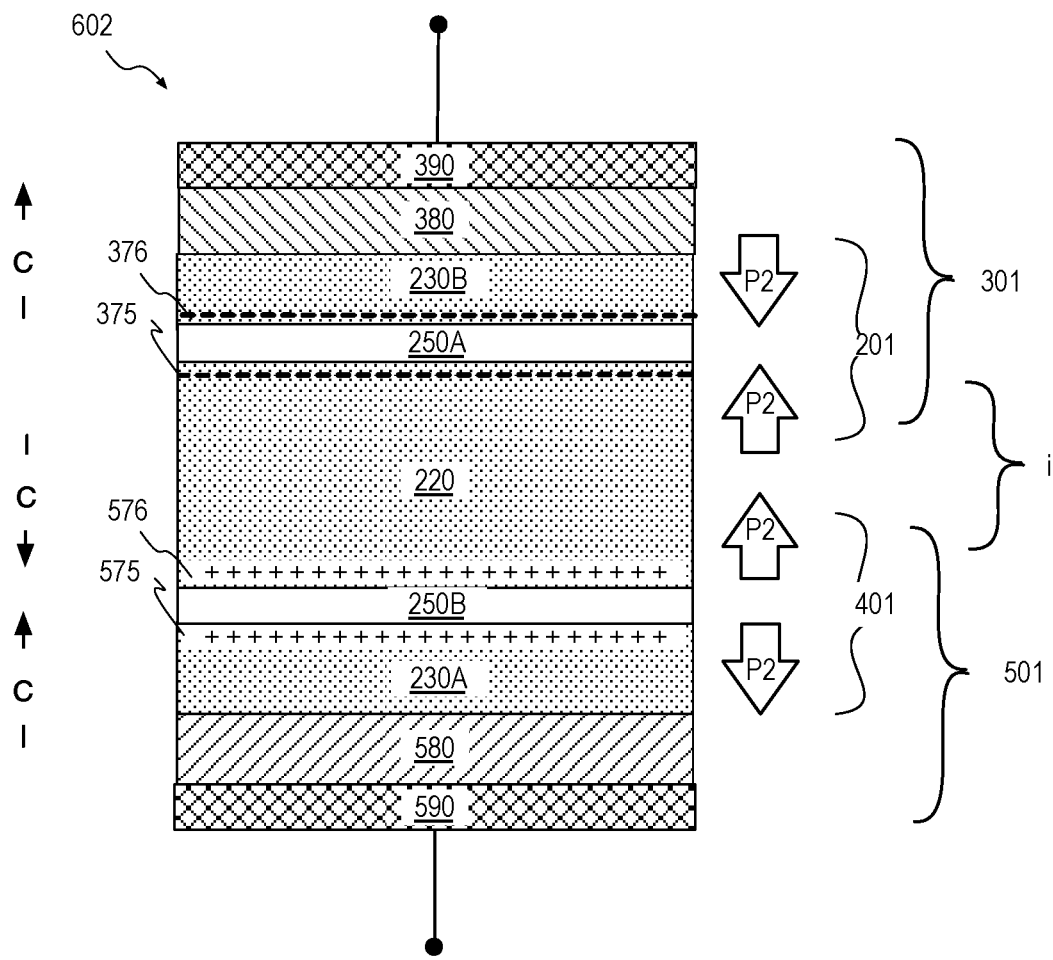
FIG. 6B is a cross-sectional view of a P-i-N diode employing two polarization junctions, in accordance with some alternative embodiments.

FIG. 6B, is a cross-sectional view of a P-i-N diode 602 that again employs two polarization junctions 201 and 401, in accordance with some alternative embodiments. In contrast to diode 601, the i-layer of diode 602 is provide by III-N material layer 220. In diode 602 there are two III-N material layers 230A and 230B that have a −c polarity, which are separated by one III-N material layer 220 that has +c polarity. For embodiments where III-N material layer 230 has the same composition as III-N material layers 220A and 220B, diode 602 is inverted relative to diode 601.

Diode 602 includes terminal 301 stacked upon terminal 501 such that the c-axes are substantially aligned parallel and anti-parallel. As shown, diode 602 includes polarization junction 401, which is p-type and has 2DHG 575 and 2DHG 576 on either side of a first intervening layer 250B. Diode 602 further includes polarization junction 201, which is n-type and has 2DEG 375 and 2DEG 376 on either side of a second intervening layer 250A. As such, terminal 301 is operative as a cathode while terminal 501 is operative as an anode. Current conduction between contact metals 390 and 590 is again predominantly along the c-axis of III-N material layers 220 and 230.

Diode 602 includes contact metals 390, 590 separated by first (bottom) III-N material layer 230A that is over terminal material 580, intervening layer 250B that is over III-N material layer 230A, III-N material layer 220 that is over intervening layer 250B, intervening layer 250A that is over III-N material layer 220, III-N material layer 230B that is over intervening layer 250B, and terminal material 380 that is over III-N material layer 230. The reference numbers introduced in the context of FIG. 2-FIG. 5 are retained in FIG. 6B for material layers that may have any of the same properties described above. In the illustrated embodiment, each of the depicted layers are in direct contact with the material layer above and below. However, one or more other material layers (not depicted) may be inserted between various ones of the illustrated layers. The materials in diode 602 may be any of those described above in the context of diode 601. Within diode 602, III-N material layer 220 is operative as an intrinsic (i) layer of the diode with p-type and n-type junctions at opposite faces of III-N material layer 220. III-N material layer 220 should be of sufficient thickness to avoid merging or band-to-band tunneling of 2DEG 375 and 2DHG 576. In some embodiments, III-N material layer 220 has a thickness greater than that of at least one III-N material layers 230A and 230B. In some embodiments, III-N material layer 220 has a thickness greater than that of each of III-N material layers 230A and 230B. In some exemplary embodiments, III-N material layer 220 is no more than 10 nm in thickness while the thicknesses of III-N material layers 230A and 230B may vary as described above.

Figure 7:
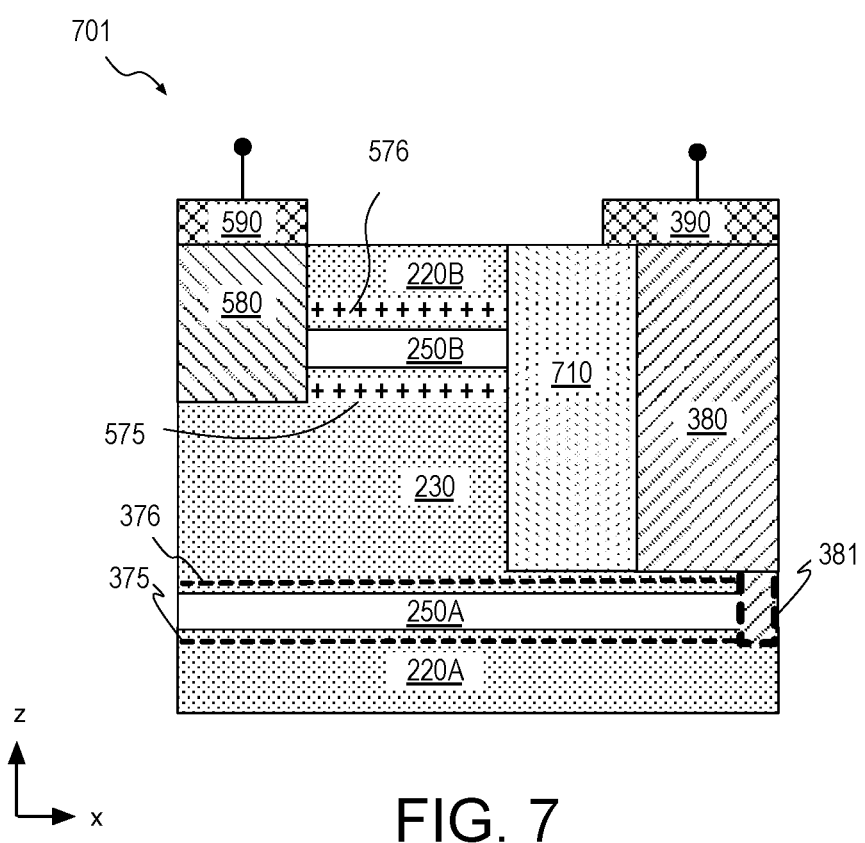
FIG. 7 is a cross-section view of a P-i-N diode employing two polarization junctions, in accordance with some alternative embodiments.

FIG. 7 is a cross-sectional view of a P-i-N diode 701 employing two polarization junctions, in accordance with some alternative embodiments. In contrast to diodes 601 and 602, diode 701 has a planar architecture with both of contact metals 390 and 590 located on a top-side of the III-N material layers 220A, 220B and 230. An isolation dielectric material 710 laterally (e.g., x-dimension) separates the anode and cathode terminals. Isolation dielectric material 710 may be any material known to be suitable for electrical device isolation, such as any dielectric material used for shallow trench isolation (STI) or interlayer dielectric (ILD) applications. In some embodiments, isolation dielectric material 710 includes both silicon and oxygen (e.g., SiO, SiON, SiOC(H), etc.). Notably, during operation, current in diode 701 can avoid transiting intervening layers 250A and/or 250B. As such, diode 701 may have lower on-state resistance than diodes 601 and 602.

As shown in FIG. 7, diode 701 includes a material stack similar to that described above for diode 601. The reference numbers introduced in the context of FIG. 2-FIG. 5 are retained in FIG. 7 for material layers that may have any of the properties as described above. In the illustrated embodiment, each of the depicted layers are in direct contact with the material layer above and below. However, one or more other material layers (not depicted) may be inserted between various ones of the illustrated layers. Diode 701 includes material layer 220A, which may be over any suitable substrate layer. An intervening layer 250A is over III-N material layer 220A. III-N material layer 230 is over intervening layer 250A. Another intervening layer 250B is over III-N material layer 230, material layer 220B is over intervening layer 250B. Terminal material 580 passes through III-N material layer 220B, passes through the underlying intervening layer 250B and contacts III-N material layer 230 proximal to charge sheet (2DHG) 575. As such, terminal material 580 makes electrical contact to charge sheet 575 (and 576) along a sidewall of terminal material 580 and a sidewall of a top thickness of III-N material layer 230. Contact area does not scale with the footprint of terminal material 580. This sidewall contact therefore bypasses intervening layer 250B. Terminal material 380 likewise passes through the III-N material layer 220B, passes through the underlying intervening layer 250B, and contacts III-N material layer 230 proximal to charge sheet (2DEG) 376. As such, terminal material 380 makes electrical contact to charge sheet 376 over the entire footprint of terminal material 380. This terminal contact therefore scales with the footprint of terminal material 380, and also bypasses the underlying intervening layer 250A. For embodiments where terminal material 380 also extends along a sidewall of material layer 230 and/or underlying III-N material layer 220A (e.g., as illustrated by dashed line 381), terminal material 380 may couple to charge sheet 376 both over an area of charge sheet 376 and along the sidewall of charge sheet 376 and/or a sidewall of charge sheet 375.

Devices employing polarization junctions, such as diodes 601, 602, or 701, may be implemented as discrete devices or, monolithically integrated into an integrated circuit (IC) that further includes other devices, such as, but not limited to transistors. Such transistors may, for example, also be implemented in the III-N material system. For example, an IC may include one or more III-N heterojunction field effect transistors (HFETs) electrically interconnected with one or more polarization junction diodes. Such HFETs may rely on polarization layers, or also employ polarization junction. In some embodiments where the NMOS HFET structure includes a polarization layer, the polarization layer is deposited over one of the III-N material layers employed in a polarization junction diode. For example, the polarization layer may be deposited on III-N material layer 220 and III-N material layer 230. The polarization layer comprises a III-N material having the same crystal polarity as III-N material layer 220 and III-N material layer 230 with which the polarization layer contacts. In exemplary embodiments, the polarization layer composition is sufficiently different from that of the III-N material layer 220 and III-N material layer 230 to induce a charge carrier sheet (e.g., 2DEG) within the III-N material layer 220 and III-N material layer 230. The HFET therefore shares at least one of III-N material layer 220 and III-N material layer 230 with the polarization junction diode. The HFET may further include a gate stack (e.g., a gate electrode separated from the III-N material layer 220 and III-N material layer 230 by a gate dielectric), and a source and a drain on opposite sides of the gate stack according to any III-N HFET architecture as embodiments herein are not limited in this respect. The polarization layer is located between the gate and each of the source and the drain to induce a charge carrier sheet that couples the source and drain together under suitable gate bias. The HFET source or drain may be of the same III-N material as one of the III-N terminal materials employed by polarization diodes described above, for example. In other embodiments, an IC may include one or more silicon metal-oxide-semiconductor (MOS) FETs electrically interconnected with one or more III-N polarization junction diodes. Such silicon-based MOS- FETs may have any device architecture known in the art as embodiments herein are not limited in this respect.

Figure 8:
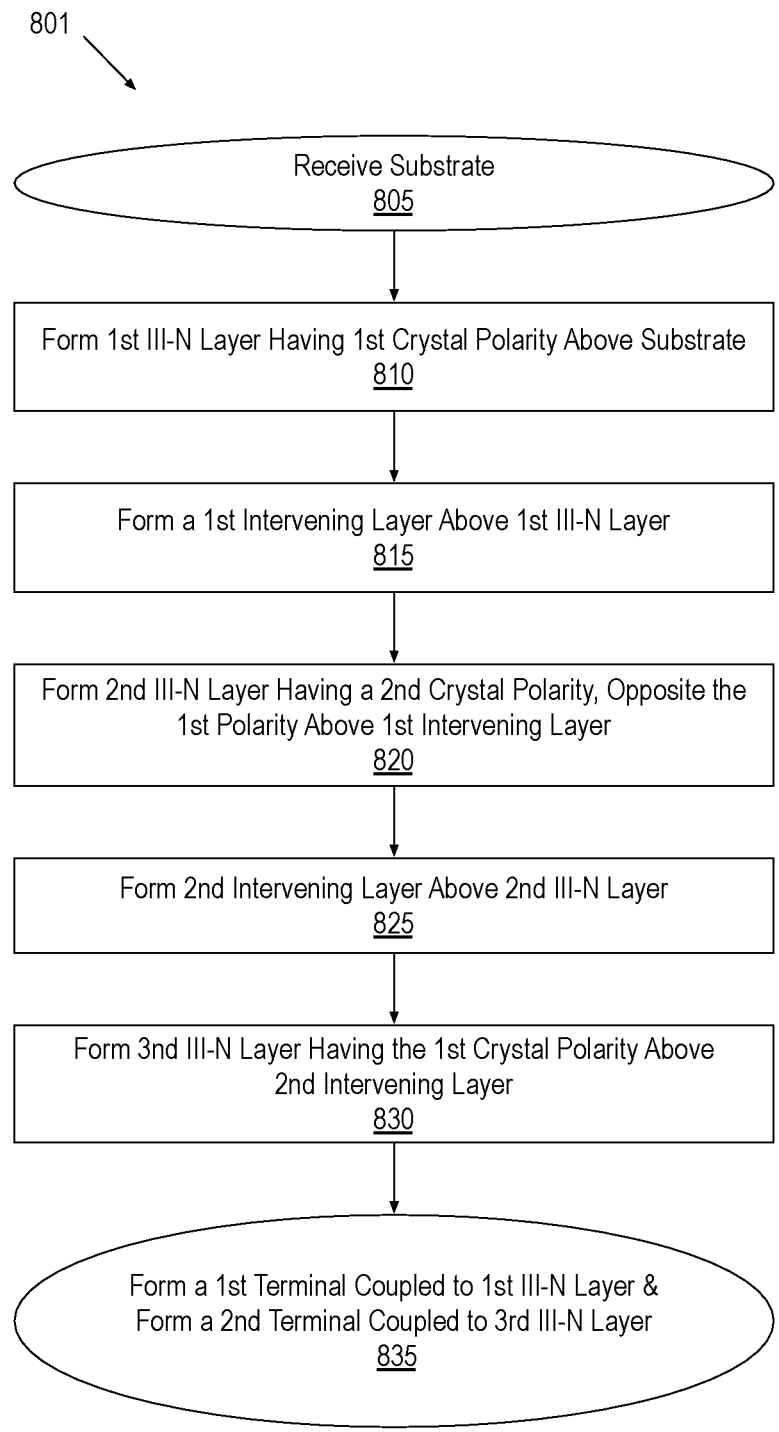
FIG. 8 is a flow diagram illustrating methods of forming a P-i-N polarization junction diode, in accordance with some embodiments.

The III-N polarization diodes described above may be fabricated using a variety of methods. FIG. 8 is a flow diagram illustrating methods 801 for forming III-N polarization junction diode, in accordance with some illustrative embodiments. Methods 801 begin at operation 805 where a substrate including a crystalline seed layer is received. The substrate received at operation 805 may be any suitable for epitaxial growth of a III-N material stack, for example. The substrate received at operation 805 may include one or more terminal material layers to which a contact may be subsequently formed.

At operation 810, a III-N epitaxial growth process is employed to form a III-N material layer having a first crystal polarity on the substrate seeding surface. Such epitaxial growth may form a continuous crystal over an entire surface of a substrate, or may be limited to crystalline islands or mesas occupying only a portion of a substrate surface as controlled through a templating pattern. Polarity of the crystal growth may be controlled through growth conditions, for example by introducing precursors under growth conditions (e.g., temperature and partial pressures) that favor nucleation having either –c or +c polarity out of the plane of the seeding substrate surface. One or more III-N material layers having the first crystal polarity may be grown at operation 810. In the example shown in FIG. 9A, terminal material layer 380 and III-N material layer 220A are grown with (–c) polarity out of the plane of substrate 901. Terminal material layer 380 and III-N material layer 220A may have any of the compositions described above. For example, terminal material layer 380 may be an impurity-doped III-N material while III-N material layer is intrinsic binary GaN. Terminal material layer 380 and III-N material layer 220A may be epitaxially grown over a substrate 901 with any growth technique(s) known to be suitable for III-N crystals, such as, but not limited to, metal-organic chemical vapor deposition (MOCVD), vapor phase epitaxy (VPE), or molecular beam epitaxy (MBE). In some embodiments, elevated temperatures of 600° C., or more, are employed. The growth of terminal material layer 380 and III-N material layer 220A may include deposition of a seed layer, such as AlN (not depicted) and further include growth of in-situ (donor) doped GaN using first epitaxial growth conditions (e.g., a first growth pressure, a first growth temperature, a first V/III growth precursor ratio, and a first impurity source partial pressure) followed by intrinsic GaN growth using second epitaxial growth conditions (e.g., a second growth pressure, a second growth temperature, a second V/III growth precursor ratio and a second impurity source partial pressure).

Figure 9A:
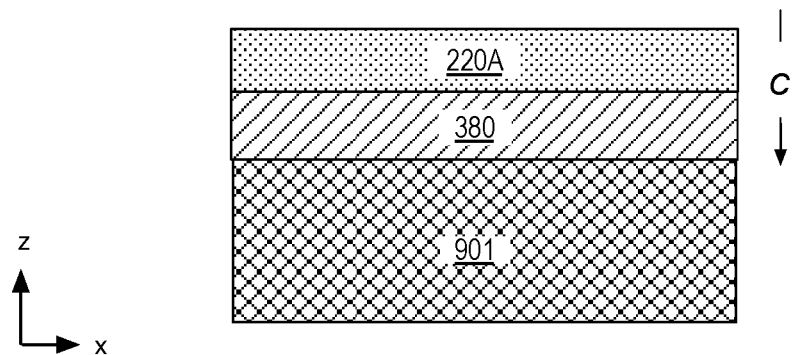
FIGS. 9A, 9B, 9C, 9D, and 9E are cross-sectional views of a III-N polarization junction diode evolving as selected operations in the methods illustrated in FIG. 8 are performed, in accordance with some embodiments.

In further reference to FIG. 9A, substrate 901 may include any suitable material or materials. For example, substrate 901 may have cubic crystallinity with a predetermined crystal orientation (e.g., (100), (111), (110), or the like). For such embodiments, template structures may be formed on a cubic substrate surface, such as a (100) surface. III-N crystals may also be grown on other surfaces (e.g., 110, 111, miscut or offcut, for example 2-10° toward (110), etc.). In some such examples, substrate 901 includes a semiconductor material such as monocrystalline silicon (Si), germanium (Ge), silicon germanium (SiGe). Other crystalline materials, such as, but not limited to, gallium arsenide (GaAs), or silicon carbide (SiC), sapphire ($Al_2O_3$) are also suitable as a growth surface of substrate 901. In some examples, substrate 901 includes silicon having a (100) crystal orientation with a 4°-11° miscut (with 4°-6° being particularly advantageous). In other examples, substrate 901 includes silicon with a crystal orientation of (111), which may offer the advantage of a smaller lattice mismatch with III-N materials than (100) or (110) silicon surfaces. Substrate 901 may include one or more buffer layers of III-N material. Substrate 901 may also include a host substrate material upon which a III-N crystal has been bonded, in which case the host substrate may be crystalline, or not (e.g., glass, polymer, etc.). In various examples, substrate 901 may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, or the like.

Figure 9B:
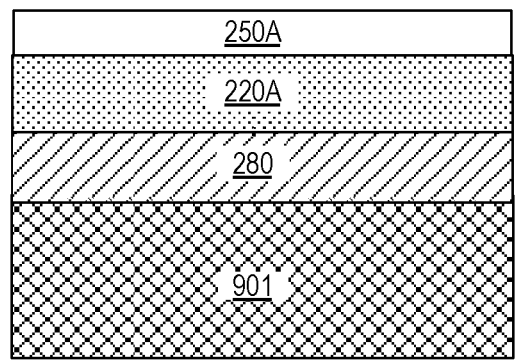

Returning to FIG. 8, methods 801 continue at operation 815 where a first intervening layer is formed above the III-N material layer having the first crystal polarity. As noted above, the intervening layer is to decouple the crystal polarity of two adjacent III-N material layers and thereby facilitate a polarity inversion. In some embodiments, operation 815 entails an epitaxial growth of a precursor material that is suitable as a nucleation layer for III-N epitaxial growths. In the example shown in FIG. 9B, any of the materials described above may have been epitaxially grown directly on the III-N material layer 220A. Such precursor material may also have the first crystal polarity, for example, or an alternative crystal polarity, or alternative crystallinity (e.g., trigonal or cubic). In some embodiments, operation 815 further entails an oxidation of the precursor material epitaxially grown over the III-N material layer. For example, a binary AlN layer with the first crystal polarity may be grown at operation 815 and then subsequently oxidized, for example with any in-situ or ex-situ oxidation technique known to be suitable for at least a surface of a crystalline AlN layer. This oxidized surface (e.g., $Al_xO_y$) may then be advantageous for inverting the polarity of III-N material during subsequent epitaxial growth processes. Similar growth and oxidation processes may also be performed to form other material compositions, such as, but not limited to, $Sc_xO_y$, or AlScO.

In some alternative embodiments, operation 815 includes the deposition of an amorphous or polycrystalline material that is suitable as a bonding layer between two III-N material layers. Any deposition process known to be suitable for any of the exemplary materials described above may be employed to form the amorphous or polycrystalline intervening layer over. For example, chemical vapor deposition (CVD), plasma-enhanced CVD (PECVD), or atomic layer deposition (ALD) may be employed at operation 815 to deposit a silicon oxide, or any of the high-k materials described above.

Returning to FIG. 8, methods 801 continue at operation 820 where a III-N layer having a second crystal polarity, substantially opposite to, or inverted from, the first crystal polarity is formed above the intervening layer deposited at operation 815. In the example shown in FIG. 9C, III-N material layer 230 has been formed directly on intervening layer 250A. Polarity of the crystal growth at operation 820 may be controlled through growth conditions, for example by introducing precursors under growth conditions (e.g., temperature and partial pressures) that favor nucleation having either –c or +c polarity out of the plane of the seeding substrate surface. One or more III-N material layers having the second crystal polarity may be grown at operation 820. In the example shown in FIG. 9C, III-N material layer 230 is grown with (+c) polarity out of the plane of substrate 901.

Figure 9C:
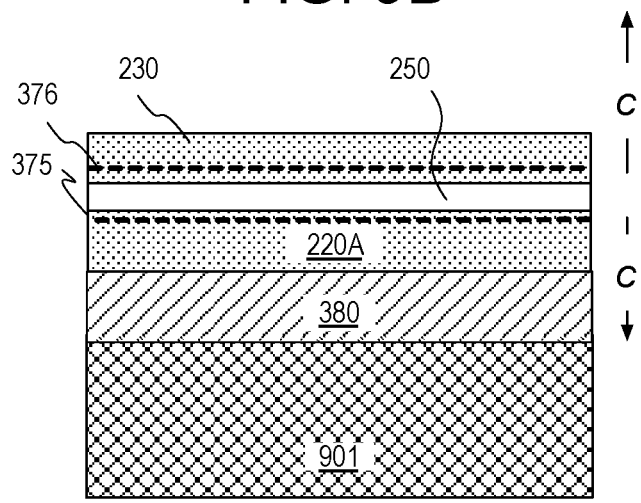

In some embodiments where operation 820 entails the growth of multiple III-N material layers, both a nucleation layer and a bulk III-N layer of greater thickness are epitaxially grown. For example, a nucleation layer of a material other than binary GaN (e.g., AlN) may be epitaxially grown on the intervening layer (e.g., $Al_xO_y$). With proper growth conditions, the nucleation layer may initiate epitaxial growth with the desired (+c) polarity, and operation 820 may continue with the growth of any additional III-N material (e.g., binary GaN). The epitaxial growth of III-N material layer 230 may be terminated upon reaching a desired target thickness. As shown in FIG. 9C, polarization doping (e.g., 2DEGs 375, 376) occurs upon the formation of III-N material layer 230.

In alterative embodiments, for example where an amorphous or polycrystalline intervening layer was deposited or otherwise formed at operation 815, layer transfer and/or wafer bonding processes may be practiced at operation 820. For example, one or more crystalline III-N material layers having the desired second crystal polarity may be provided on a sacrificial substrate. The sacrificial substrate may be, for example, any of the materials described above for substrate 901. In one such embodiment, a III-N material having a desired composition is grown with (−c) polarity over the sacrificial substrate. This structure is then inverted to mate a surface of this III-N material to a surface of the intervening layer, thereby providing the desired (−c) to (+c) polarity inversion. The sacrificial substrate may then be removed, if desired.

Returning to FIG. 8, methods 801 continue at operation 825 where another intervening material layer is formed over the III-N layer having the second crystal polarity. As noted above, this second intervening layer is also to decouple the crystal polarity of two adjacent III-N material layers and thereby facilitate another polarity inversion, substantially in the same manner as the first inversion. In some embodiments, operation 825 entails an epitaxial growth of a material that is suitable as a nucleation layer for further III-N epitaxial growths. In some embodiments, operation 825 may therefore be the same as operation 815. Methods 801 then continue at operation 830 where a third III-N layer having crystal polarity inverted from the second polarity (i.e., inverted back to the first polarity) is formed above the intervening layer that was formed at operation 825.

Figure 9D:
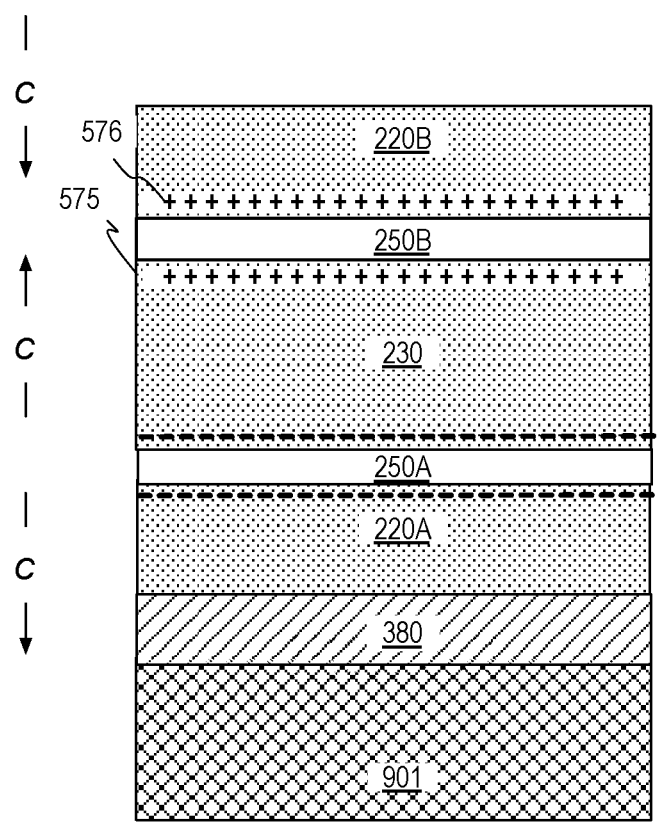

In the example shown in FIG. 9D, any of the materials described above may be epitaxially grown directly on the III-N material layer 230. Such a growth may also have the second crystal polarity, for example. In some embodiments, operation 825 further entails an oxidation of precursor material epitaxially grown over the III-N material layer having the second crystal polarity, the first polarity, alternative polarity, or other crystallinity (e.g., trigonal or cubic). For example, a binary AlN layer with the second crystal polarity may be grown at operation 825 as a precursor material and then subsequently oxidized, for example with any in-situ or ex-situ oxidation technique known to be suitable for oxidizing at least a surface of a crystalline AlN layer. This oxidized surface (e.g., $Al_xO_y$) may then be advantageous for inverting the polarity of III-N material during subsequent epitaxial growth processes. Similar growth and oxidation processes may also be performed to form other material compositions, such as, but not limited to, $Sc_xO_y$, or AlScO.

In some alternative embodiments, operation 825 includes the deposition of an amorphous or polycrystalline material that is suitable as a bonding layer between two III-N material layers. Any deposition process known to be suitable for any of the exemplary materials described above may be employed to form an amorphous or polycrystalline intervening layer over. For example, chemical vapor deposition (CVD), plasma-enhanced CVD (PECVD), or atomic layer deposition (ALD) may be employed at operation 825 to deposit a silicon oxide, or any of the high-k materials described above.

In the example shown in FIG. 9D, III-N material layer 220B has been formed directly on intervening layer 250. Polarity of the crystal growth may be controlled through growth conditions, for example by introducing precursors under growth conditions (e.g., temperature and partial pressures) that favor nucleation having either −c or +c polarity out of the plane of the seeding substrate surface. One or more III-N material layers having the first crystal polarity may be grown at operation 830. In the example shown in FIG. 9C, III-N material layer 220B is grown with (−c) polarity out of the plane of intervening layers 250A, 250B and/or substrate 901. In some embodiments where operation 830 entails the growth of multiple III-N material layers, both a nucleation layer and a bulk III-N layer of greater thickness are epitaxially grown. For example, a nucleation layer of a material other than binary GaN (e.g., AlN) may be epitaxially grown on the intervening layer (e.g., $Al_xO_y$). With proper growth conditions, the nucleation layer may initiate epitaxial growth with the desired (−c) polarity, and operation 830 may continue with the growth of any additional III-N material (e.g., binary GaN). The epitaxial growth of III-N material layer 220B may be terminated upon reaching a desired target thickness. As shown in FIG. 9D, polarization doping (e.g., 2DHGs 575, 576) occurs upon the formation of III-N material layer 220B.

In alterative embodiments, for example where an amorphous intervening layer was deposited or otherwise formed at operation 825, layer transfer and/or wafer bonding processes may be practiced at operation 830. Such bonding and/or layer transfer may proceed as a second iteration of a bonding/transfer process performed at operation 815. Alternatively a stack of material layers including a polarization junction fabricated upstream by any means may be transferred and/or bonded at operation 815 or operation 830 to arrive at the same final structure. For example, one or more crystalline III-N material layers having the desired first crystal polarity may be provided on a sacrificial substrate. The sacrificial substrate may be, for example, any of the materials described above for substrate 901. In one such embodiment, a III-N material having a desired composition is grown with (+c) polarity over the sacrificial substrate. This structure is then inverted to mate a surface of this III-N material to a surface of the intervening layer, thereby fabricating in the desired (+c) to (−c) polarity inversion. The sacrificial substrate may then be removed.

Figure 9E:
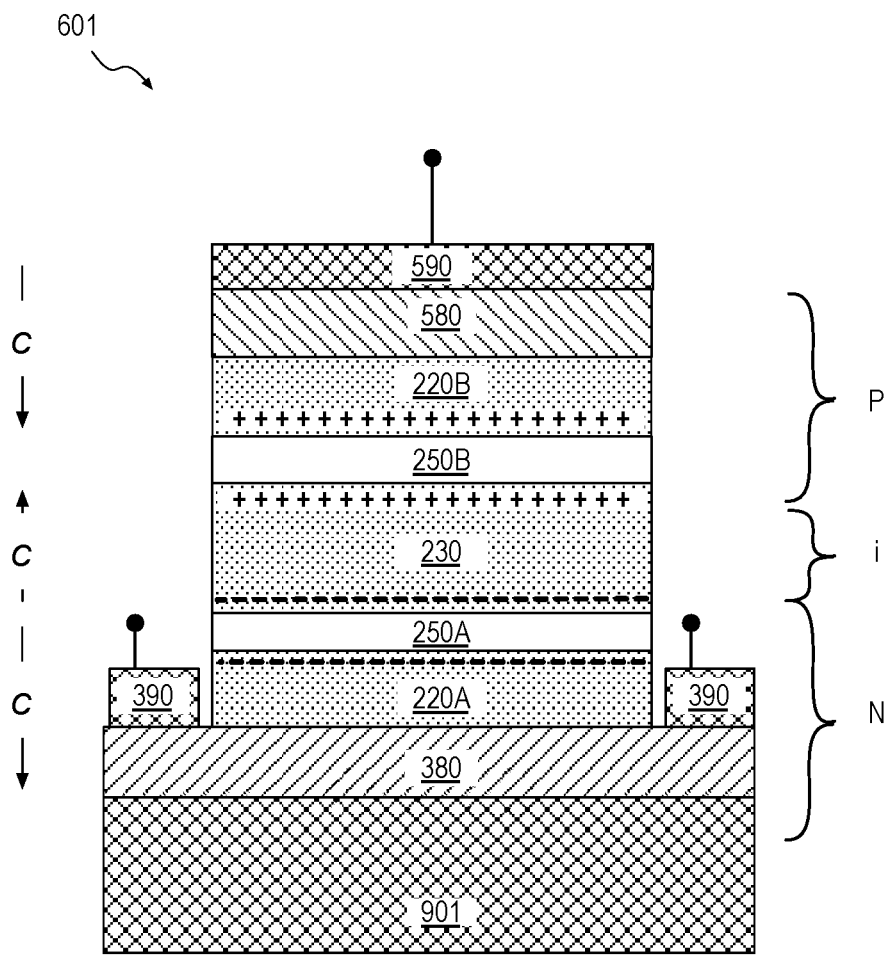

Returning to FIG. 8, methods 801 complete at operation 835 where one or more interconnect levels, for example including diode contact metallization, are formed using any techniques known to be suitable for the purpose. For embodiments where the diodes are to be monolithically integrated into an IC, any known back-end-of-line (BEOL) processing may be performed at operation 835 to complete the IC. Following operation 835, an IC including III-N polarization junction diodes, or discrete III-N polarization junction diodes are substantially complete and may be singulated and packaged following any suitable techniques. In the example shown in FIG. 9E, contact metals 390 and 590 has been deposited in contact with terminal material layers 380 and 580, respectively. Any of the contact metallizations described above, may be deposited at operation 835 to complete the diode. Any number of additional interconnect metallization levels (represented as terminal nodes in FIG. 9E) may further electrically couple contact metals 390, 590 to other circuit nodes. For example, one or more interconnect metallization level may couple contact metal 390 or 590 to a terminal of a transistor according to the schematic of FIG. 1.

FIGS. 10A, 10B, 10C, and 10D are cross-sectional views of a III-N polarization junction diode evolving as selected operations in the methods illustrated in FIG. 8 are performed, in accordance with some alternative embodiments suitable for fabricating diode 701 (FIG. 7).

Figure 10A:
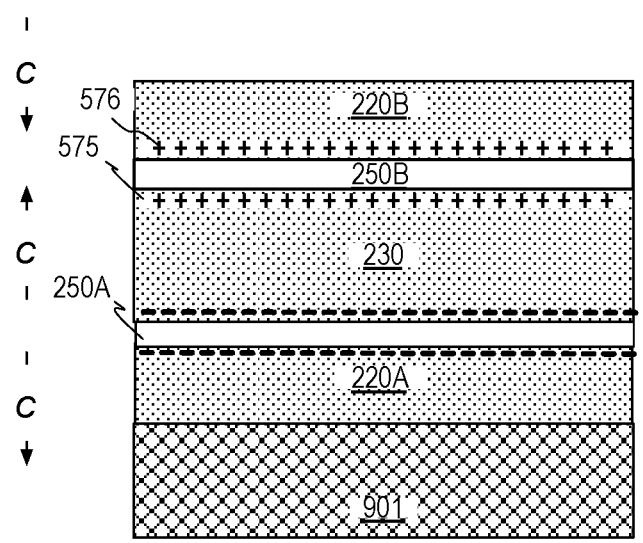
FIGS. 10A, 10B, 10C, and 10D are cross-sectional views of a III-N polarization junction diode evolving as selected operations in the methods illustrated in FIG. 8 are performed, in accordance with some alternative embodiments.

In the example shown in FIG. 10A, III-N material layer 220A with (−c) polarity out of the plane of substrate 901 is epitaxially grown over substrate 901, for example with any growth technique(s) described above. Intervening layer 250A is then deposited. III-N material layer 230 is then epitaxially grown with (+c) polarity out of the plane of intervening layer 250A. Intervening layer 250B is then deposited. III-N material layer 220B is epitaxially grown with (−c) polarity out of the plane of intervening layer 250B to complete the material stack.

Figure 10B:
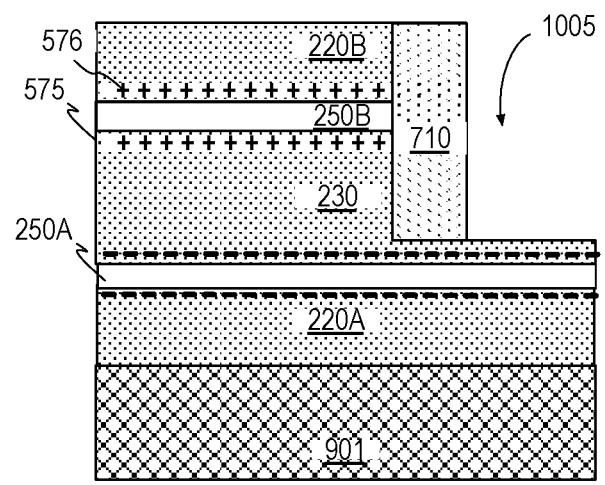

As further shown in FIG. 10B, a trench 1005 is etched through III-N material layer 220B, through intervening layer 250B, and partially through III-N material layer 230 using one or more etch processes suitable for the material compositions. Trench 1005 is then at least partially backfilled with isolation dielectric 710. In some embodiments, trench 1005 is completely backfilled with isolation dielectric 710, for example using any STI process where a polish planarizes a top surface of isolation dielectric 710 with III-N material layer 220B. Alternatively, trench 1005 is only partially backfilled with isolation dielectric 710, for example using a conformal dielectric deposition process followed by an anisotropic dielectric etch process to form a sidewall spacer of isolation dielectric 710, as illustrated in FIG. 10B.

Figure 10C:
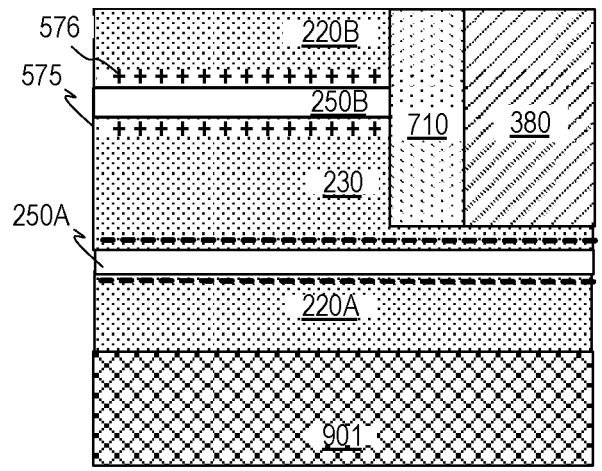

As further shown in FIG. 10C, terminal material 380 is deposited and or grown within a remainder of trench 1005. For alternative embodiments where trench 1005 was completely backfilled with isolation dielectric material 710, another trench may be etched through III-N material layer 220B, through intervening layer 250B, and partially through III-N material layer 220A, and then backfilled with terminal material 380. In still other embodiments, a portion of isolation dielectric material 710 is etched to re-expose a portion of III-N material 230. This opening is then backfilled with terminal material 380.

Figure 10D:
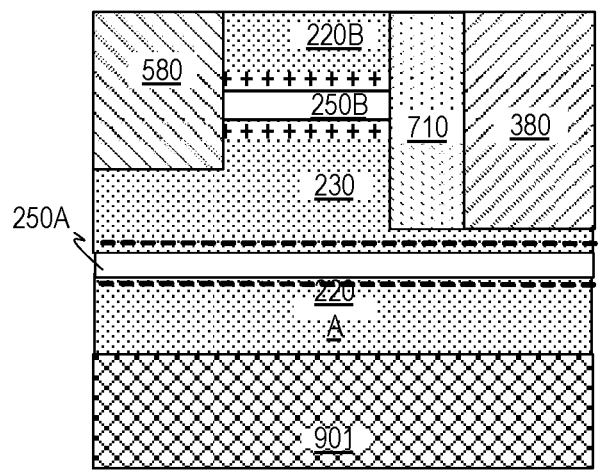

As further shown in FIG. 10D, another trench is then etched through the III-N material layer 220B, through intervening layer 250B, and partially through III-N material layer 230 using one or more etch processes suitable for the material compositions. Relative to trench 1005 (FIG. 10B), the thickness of III-N material layer 230 removed can be much less. Terminal material 380 is deposited and or grown within this trench. One or more planarization processes (e.g., a polish) may be performed to planarize a top surface of terminal materials 380, 580 with a top surface of III-N material 220B. Contact metallization may then be deposited an patterned according to any suitable techniques known in the art.

Figure 11:
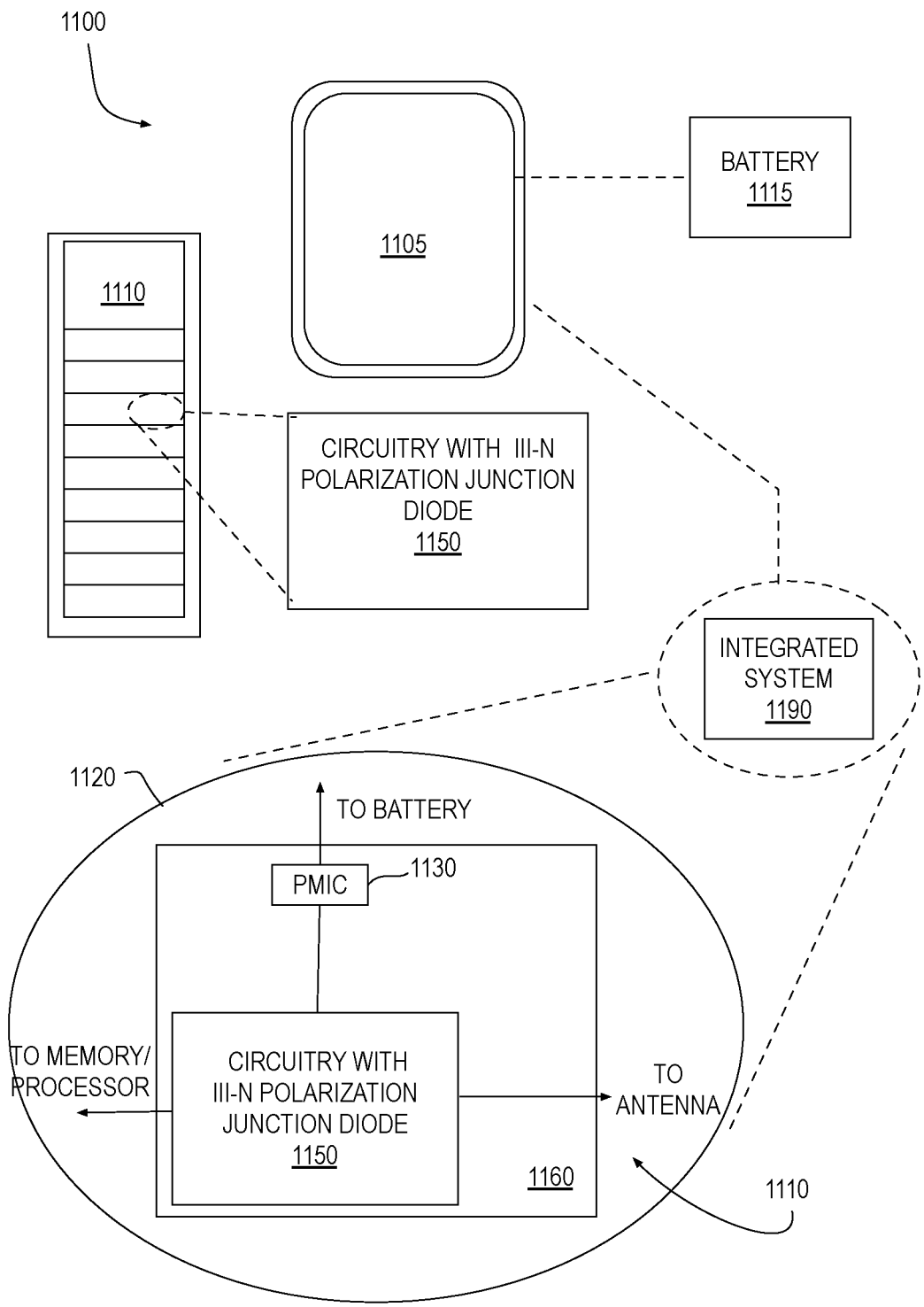
FIG. 11 illustrates a mobile computing platform and a data server machine employing an IC electrically coupled to a III-N polarization junction diode, in accordance with embodiments.

FIG. 11 illustrates a system 1100 in which a mobile computing platform 1105 or a data server machine 1110 employs an circuitry including at least one III-N polarization junction diode, in accordance with some embodiments. The server machine 1110 may be any commercial server, for example including any number of high-performance computing platforms disposed within a rack and networked together for electronic data processing, which in the exemplary embodiment includes circuitry 1150. In accordance with mobile embodiments of system 1100, mobile computing platform 1105 may be any portable device configured for each of electronic data display, electronic data processing, wireless electronic data transmission, or the like. For example, the mobile computing platform 1105 may be any of a tablet, a smart phone, laptop computer, etc., and may include a display screen (e.g., a capacitive, inductive, resistive, or optical touchscreen), a chip-level or package-level integrated system 1190, and a battery 1115.

Whether disposed within the integrated system 1190 illustrated in the expanded view 1120, or as a stand-alone packaged chip within the server machine 1110, an IC is electrically coupled to at least one III-N polarization junction diode, for example as describe elsewhere herein. The circuitry 1150 may be further affixed to a board, a substrate, or an interposer 1160 along with a power management integrated circuit (PMIC). Functionally, PMIC 1130 may perform battery power regulation, DC-to-DC conversion, etc., and so has an input coupled to battery 1115 and with an output providing a current supply to other functional modules.

Circuitry 1150, in some embodiments, includes RF (wireless) integrated circuitry (RFIC) further including a wideband RF (wireless) transmitter and/or receiver (TX/RX including a digital baseband and an analog front end module comprising a power amplifier on a transmit path and a low noise amplifier on a receive path). The RFIC includes at least one III-N heterostructure diode, for example in a overvoltage protection circuit as describe elsewhere herein. The RFIC has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 12:
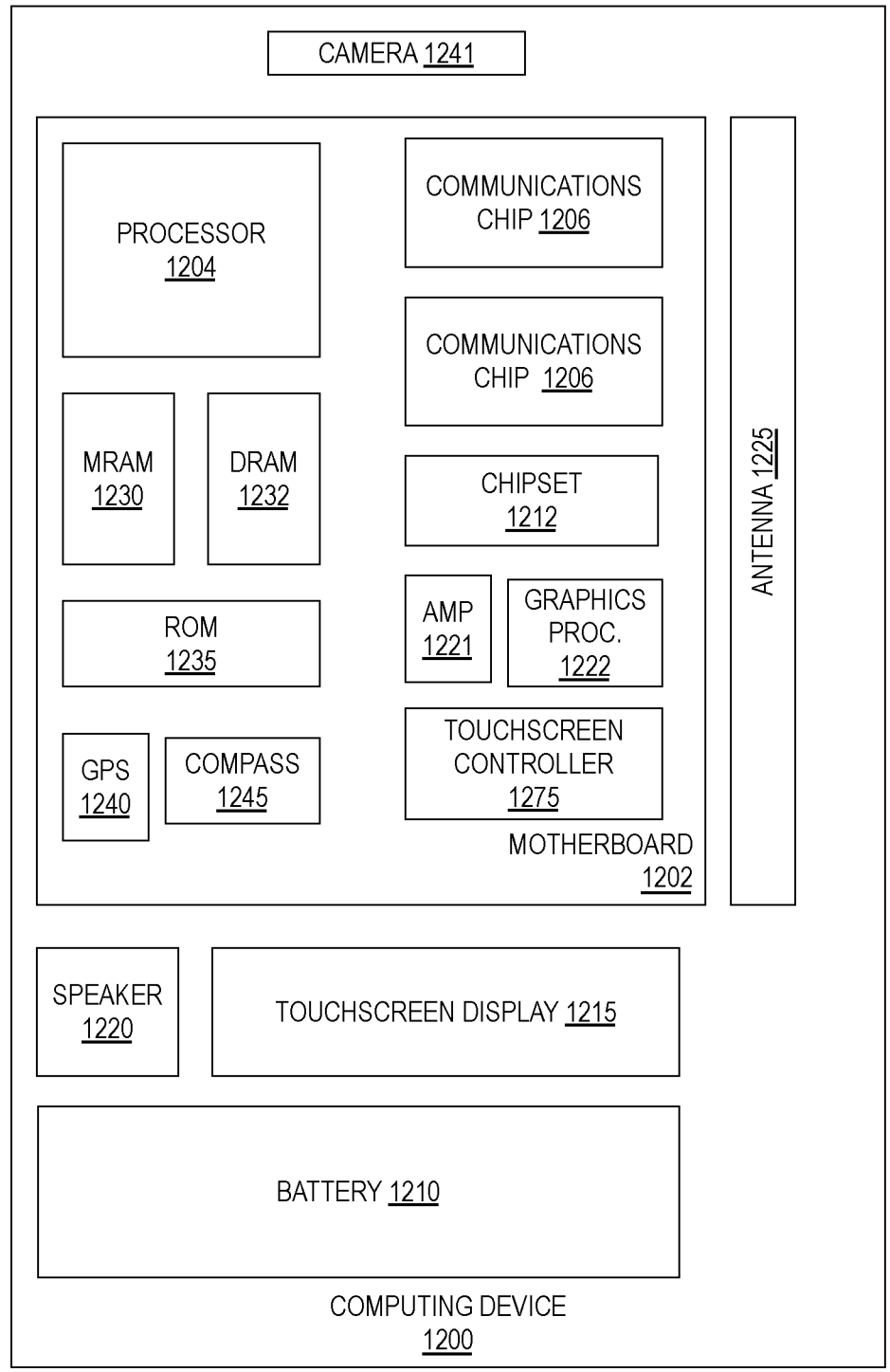
FIG. 12 is a functional block diagram of an electronic computing device, in accordance with some embodiments.

FIG. 12 is a functional block diagram of a computing device 1200, arranged in accordance with at least some implementations of the present disclosure. Computing device 1200 may be found inside platform 1105 or server machine 1110, for example. Device 1200 further includes a motherboard 1202 hosting a number of components, such as, but not limited to, a processor 1204 (e.g., an applications processor), which may further include at least one III-N polarization junction diode, in accordance with embodiments of the present invention. Processor 1204 may for example include power management integrated circuitry (PMIC) that includes at least one III-N polarization junction diode. Processor 1204 may be physically and/or electrically coupled to motherboard 1202. In some examples, processor 1204 includes an integrated circuit die packaged within the processor 1204. In general, the term "processor" or "microprocessor" may refer to any device or portion of a device that processes electronic data from registers and/or memory to transform that electronic data into other electronic data that may be further stored in registers and/or memory.

In various examples, one or more communication chips 1206 may also be physically and/or electrically coupled to the motherboard 1202. In further implementations, communication chips 1206 may be part of processor 1204. Depending on its applications, computing device 1200 may include other components that may or may not be physically and electrically coupled to motherboard 1202. These other components include, but are not limited to, volatile memory (e.g., MRAM 1230, DRAM 1232), non-volatile memory (e.g., ROM 1235), flash memory, a graphics processor 1222, a digital signal processor, a crypto processor, a chipset, an antenna 1225, touchscreen display 1215, touchscreen controller 1275, battery 1210, audio codec, video codec, power amplifier 1221, global positioning system (GPS) device 1240, compass 1245, accelerometer, gyroscope, audio speaker 1220, camera 1241, and mass storage device (such as hard disk drive, solid-state drive (SSD), compact disk (CD), digital versatile disk (DVD), and so forth), or the like.

Communication chips 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1206 may implement any of a number of wireless standards or protocols, including but not limited to those described elsewhere herein. As discussed, computing device 1200 may include a plurality of communication chips 1206. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

In various examples, one or more communication chips 1206 may also be physically and/or electrically coupled to the motherboard 1202. In further implementations, communication chips 1206 may be part of processor 1204. Depending on its applications, computing device 1200 may include other components that may or may not be physically and electrically coupled to motherboard 1202. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1206 may implement any of a number of wireless standards or protocols, including but not limited to those described elsewhere herein. As discussed, computing device 1200 may include a plurality of communication chips 1206. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first examples, a diode structure includes a first layer comprising a Group III-nitride (III-N) material having a first crystal polarity, a second layer comprising a III-N material having a second crystal polarity, inverted from the first crystal polarity. The diode structure includes an intervening layer between the first and the second layers, wherein the intervening layer comprises other than a III-N material, and a first diode contact electrically coupled across at least one of the first and second layers to a second diode contact.

In one or more second examples, for any of the first examples the first layer comprises a first III-N material, and the first diode contact is electrically coupled to the first III-N material through a first terminal material having a higher concentration of donor impurities than the first III-N material.

In one or more third examples, for any of the first through the second examples the diode structure further comprises a third layer comprising a III-N material having the first crystal polarity a second intervening between the second layer and the third layer, wherein the second intervening layer comprises other than a III-N material, and the second diode contact is coupled to the third layer through a second III-N terminal material having a higher concentration of acceptor impurities than the third layer.

In one or more fourth examples, for any of the first through the third examples a group III-face of the second layer is adjacent to one of the intervening layers and a nitrogen (N)-face of the second layer is adjacent to another of the intervening layers, a group III-face of the first layer is facing the group III-face of the second layer, and a nitrogen (N)-face of the third layer is facing the nitrogen (N)-face of the second layer.

In one or more fifth examples, for any of the first through the fourth examples a c-axis of the first, second and third layers is oriented substantially normal to a plane of the intervening layers with polar faces of the first, second, and third layers separated by the intervening layers.

In one or more sixth examples, for any of the first through the fifth examples the second and third layers comprise the first III-N material, and the first and second III-N terminal materials have a higher concentration of Indium than the first III-N material.

In one or more seventh examples, for any of the first through the sixth examples the first III-N terminal material contacts a sidewall of the second layer proximal to a first charge carrier sheet of a first polarization junction, and the second III-N terminal material contacts a top surface of the second layer proximal to a second charge carrier sheet of a second polarization junction.

In one or more eighth examples, for any of the first through the seventh examples the diode structure further comprising an isolation dielectric material between the first and second III-N terminal materials, wherein the isolation dielectric material extends through the first polarization junction but not the second polarization junction.

In one or more ninth examples, for any of the first through the eighth examples the first III-N material is binary GaN.

In one or more tenth examples, for any of the first through the ninth examples the intervening layers each have a thickness no more than 5 nm.

In one or more eleventh examples, for any of the first through the tenth examples the intervening layers each comprise oxygen and at least one of a metal, a rare earth, or a lanthanide.

In one or more twelfth examples, for any of the first through the eleventh examples the intervening layers are crystalline.

In one or more thirteenth examples, for any of the first through the twelfth examples the intervening layers are amorphous.

In one or more fourteenth examples, for any of the first through the thirteenth examples the intervening layers comprise at least one of silicon and nitrogen.

In one or more fifteenth examples, a computer platform includes one or more RF transceiver, and an antenna coupled to the RF transceiver, wherein the RF transceiver comprises a diode. The diode comprises a first layer comprising a Group III-N material having a first crystal polarity, a second layer comprising a Group III-N material having a second crystal polarity, inverted from the first crystal polarity, an intervening layer between the first and the second layers, wherein the intervening layer comprises other than a III-N material, and a first terminal electrically coupled across at least one of the first and second layers to a second terminal.

In one or more sixteenth examples, for any of the fifteenth examples the platform comprises a processor communicatively coupled to the RF transceiver, and a battery coupled to at least one of the processor and RF transceiver. At least one of the processor and the transceiver further comprises an NMOS transistor, comprising at least one of the first, second, or third layers. A polarization layer on the first, second, or third layer, the polarization layer comprising a III-N material having the same crystal polarity as the first, second, or third layer, and a source, a drain, and a gate coupled to the first, second, or third layer, wherein the source and the drain are on opposite sides of the gate and the polarization layer is located between the gate and each of the source and the drain.

In one or more seventeenth examples, for any of the fifteenth through the sixteenth examples the first layer comprises a first Group III-N material. The first diode terminal comprises a second Group III-N material having a higher concentration of donor impurities than the first Group III-N material. The source and drain comprises the second Group III-N material.

In one or more eighteenth examples, a method of forming a semiconductor device comprises forming, over a first layer comprising a Group III-nitride (III-N) material having a first crystal polarity, a first intervening layer comprising other than a III-N material. Forming, over the first intervening layer, a second layer comprising a III-N material having a second crystal polarity, opposite the first polarity. Forming a second intervening layer over the second layer, wherein the second intervening layer comprises other than a III-N material. Forming, over the second intervening layer, a third layer comprising a III-N material having the first crystal polarity, forming a first contact to the first layer, and forming a second contact to the third layer.

In one or more nineteenth examples, for any of the eighteenth examples, forming at least one of the first and second intervening layers further comprises epitaxially depositing a precursor material layer comprising Al and oxidizing the precursor material layer.

In one or more twentieth examples, for any of the eighteenth through nineteenth examples forming at least one of the second or third layers further comprises epitaxially growing the second or third layer from a surface of one of the intervening layers.

In one or more twenty-first examples forming at least one of the first and second intervening layers further comprises chemical vapor deposition of an amorphous material. Forming at least one of the second or third layers further comprises bonding a III-N material to the amorphous material.

In one or more twenty-second examples, for any of the eighteenth through the twenty-first examples forming the first contact to the first layer further comprises epitaxially growing the first layer on an n-type $In_xGa_{1-x}N$ layer, and depositing a first contact metal on a portion of the n-type $In_xGa_{1-x}N$ layer. Forming the second contact to the third layer further comprises epitaxially growing a p-type $In_xGa_{1-x}N$ layer, and depositing a second contact metal on a portion of the p-type $In_xGa_{1-x}N$ layer.

In one or more twenty-third examples, for any of the eighteenth through the twenty-second examples forming the first, second, and third layers further comprises epitaxially growing the III-N material with the c-axis oriented substantially normal to a plane of the first intervening layer.

In one or more twenty-fourth examples, for any of the eighteenth through the twenty-third examples forming the second layer further comprises epitaxially growing GaN with a Ga-face proximal to the first intervening layer and the N-face proximal to the second intervening layer. Forming the third layer further comprises epitaxially growing GaN with a N-face proximal to the second intervening layer.

In one or more twenty-fifth examples, for any of the eighteenth through the twenty-fourth examples forming the second layer further comprises depositing a first nucleation layer comprising other than GaN prior to growing the GaN; and wherein forming the third layer further comprises depositing a second nucleation layer comprising other than GaN prior to growing the GaN.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:
1. A diode structure, comprising:
 a first layer comprising a Group III-nitride (III-N) material having a first crystal polarity;
 a second layer comprising a III-N material having a second crystal polarity, opposite to the first crystal polarity;
 an intervening layer between the first and the second layers, wherein the intervening layer comprises other than a III-N material; and
 a first contact electrically coupled across at least one of the first and second layers to a second contact.

2. The diode structure of claim 1, wherein:
the first layer comprises a first III-N material; and
the first contact is electrically coupled to the first III-N material through a first terminal material having a higher concentration of donor impurities than the first III-N material.

3. The diode structure of claim 2, further comprising:
a third layer comprising a III-N material having the first crystal polarity;
a second intervening layer between the second layer and the third layer, wherein the second intervening layer comprises other than a III-N material; and
wherein the second contact is coupled to the third layer through a second III-N terminal material having a higher concentration of acceptor impurities than the third layer.

4. The diode structure of claim 3, wherein:
a group III-face of the second layer is adjacent to one of the intervening layers and a nitrogen (N)-face of the second layer is adjacent to another of the intervening layers;
a group III-face of the first layer is facing the group III-face of the second layer; and
a nitrogen (N)-face of the third layer is facing the nitrogen (N)-face of the second layer.

5. The diode structure of claim 3, wherein a c-axis of the first, second and third layers is oriented substantially normal to a plane of the intervening layers with polar faces of the first, second, and third layers separated by the intervening layers.

6. The diode structure of claim 3, wherein:
the second and third layers comprise the first III-N material; and
the first and second III-N terminal materials have a higher concentration of Iridium than the first III-N material.

7. The diode structure of claim 1, wherein:
the first III-N terminal material contacts a sidewall of the second layer proximal to a first charge carrier sheet of a first polarization junction; and
the second III-N terminal material contacts a top surface of the second layer proximal to a second charge carrier sheet of a second polarization junction.

8. The diode structure of claim 7, further comprising an isolation dielectric material between the first and second III-N terminal materials, wherein the isolation dielectric material extends through the first polarization junction but not the second polarization junction.

9. The diode structure of claim 1, wherein the intervening layer has a thickness no more than 5 nm.

10. The diode structure of claim 9, wherein the intervening layer comprises oxygen and at least one of a metal, a rare earth, or a lanthanide.

11. The diode structure of 10, wherein the intervening layer is crystalline.

12. The diode structure of 10, wherein the intervening layer is amorphous.

13. The diode structure of claim 9, wherein the intervening layer comprises at least one of silicon or nitrogen.

14. A computer platform including:
one or more RF transceivers; and
an antenna coupled to the RF transceiver, wherein the RF transceiver comprises a diode, the diode comprising:
a first layer comprising a Group III-N material having a first crystal polarity;
a second layer comprising a Group III-N material having a second crystal polarity, opposite to the first crystal polarity;
an intervening layer between the first and the second layers, wherein the intervening layer comprises other than a III-N material; and
a first terminal electrically coupled across at least one of the first and second layers to a second terminal.

15. The computer platform of claim 14, comprising:
a processor communicatively coupled to the RF transceiver; and
a battery coupled to at least one of the processor and the RF transceiver, wherein
at least one of the processor and the transceiver further comprises an NMOS transistor, comprising:
at least one of the first, second, or third layers;
a polarization layer on the first, second, or third layer, the polarization layer comprising a III-N material having the same crystal polarity as the first, second, or third layer; and
a source, a drain, and a gate coupled to the first, second, or third layer, wherein the source and the drain are on opposite sides of the gate and the polarization layer is located between the gate and each of the source and the drain.

16. The computer platform of claim 15, wherein:
the first layer comprises a first Group III-N material;
the first terminal comprises a second Group III-N material having a higher concentration of donor impurities than the first Group III-N material; and
the source and the drain comprises the second Group III-N material.

17. A method of forming a semiconductor device, the method comprising:
forming a first intervening layer over a first layer comprising a Group III-nitride (III-N) material having a first crystal polarity, wherein the first intervening layer comprises other than a III-N material;
forming a second layer over the first intervening layer, wherein the second layer comprises a III-N material having a second crystal polarity, opposite the first polarity;
forming a second intervening layer over the second layer, wherein the second intervening layer comprises other than a III-N material;
forming a third layer over the second intervening layer, wherein the third layer comprises a III-N material having the first crystal polarity;
forming a first contact to the first layer; and
forming a second contact to the third layer.

18. The method of claim 17, wherein forming at least one of the first and second intervening layers further comprises:
epitaxially depositing a precursor material layer comprising Al; and
oxidizing the precursor material layer.

19. The method of claim 18, wherein forming at least one of the second or the third layer further comprises epitaxially growing the second or third layer from a surface of one of the intervening layers.

20. The method of claim 17, wherein forming at least one of the first and second intervening layers further comprises chemical vapor deposition of an amorphous material; and
wherein forming at least one of the second or the third layer further comprises bonding a III-N material to the amorphous material.

* * * * *